(12) United States Patent
Liu et al.

(10) Patent No.: US 11,437,288 B2
(45) Date of Patent: *Sep. 6, 2022

(54) DISPLAY DEVICE

(71) Applicant: InnoLux Corporation, Miao-Li County (TW)

(72) Inventors: Tung-Kai Liu, Miao-Li County (TW); Tsau-Hua Hsieh, Miao-Li County (TW); Wei-Cheng Chu, Miao-Li County (TW); Chun-Hsien Lin, Miao-Li County (TW); Chandra Lius, Miao-Li County (TW); Ting-Kai Hung, Miao-Li County (TW); Kuan-Feng Lee, Miao-Li County (TW); Ming-Chang Lin, Miao-Li County (TW); Tzu-Min Yan, Miao-Li County (TW); Hui-Chieh Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/228,911

(22) Filed: Apr. 13, 2021

(65) Prior Publication Data

US 2021/0233820 A1    Jul. 29, 2021

Related U.S. Application Data

(63) Continuation of application No. 16/244,484, filed on Jan. 10, 2019, now Pat. No. 11,004,753, which is a (Continued)

(30) Foreign Application Priority Data

Feb. 24, 2017 (CN) .......................... 201710103986.9

(51) Int. Cl.
*H01L 33/62* (2010.01)
*H01L 21/66* (2006.01)
(Continued)

(52) U.S. Cl.
CPC .............. *H01L 22/20* (2013.01); *B65G 43/08* (2013.01); *G01R 31/26* (2013.01); *H01L 21/288* (2013.01);
(Continued)

(58) Field of Classification Search
None
See application file for complete search history.

(56) References Cited

U.S. PATENT DOCUMENTS

| | | | |
|---|---|---|---|
| 2012/0135661 A1* | 5/2012 | Imanishi | C08L 79/08 445/24 |
| 2015/0228799 A1* | 8/2015 | Koezuka | H01L 27/124 257/43 |
| 2015/0236079 A1* | 8/2015 | Choi | H01L 29/66969 257/40 |

* cited by examiner

*Primary Examiner* — Michael A Faragalla
(74) *Attorney, Agent, or Firm* — McClure, Qualey & Rodack, LLP

(57) ABSTRACT

A display device includes a substrate, a light-emitting element, and a transistor. The substrate has a top surface. The light-emitting element is disposed on the substrate, and includes a first electrode and a second electrode. The transistor is disposed on the substrate and electrically connected to the light-emitting element. The transistor includes a gate electrode and a semiconductor layer. The semiconductor layer includes an overlapping portion overlapped with the gate electrode. The first electrode and the second electrode of the light-emitting element do not overlap with the overlapping portion along a direction perpendicular to the top surface of the substrate.

14 Claims, 38 Drawing Sheets

Related U.S. Application Data continuation of application No. 15/617,191, filed on Jun. 8, 2017, now Pat. No. 10,217,678.

(60) Provisional application No. 62/350,169, filed on Jun. 14, 2016, provisional application No. 62/355,392, filed on Jun. 28, 2016, provisional application No. 62/361,543, filed on Jul. 13, 2016, provisional application No. 62/394,225, filed on Sep. 14, 2016.

(51) Int. Cl.

| | |
|---|---|
| *H01L 25/16* | (2006.01) |
| *H01L 27/12* | (2006.01) |
| *H01L 33/38* | (2010.01) |
| *H01L 21/288* | (2006.01) |
| *H01L 21/67* | (2006.01) |
| *B65G 43/08* | (2006.01) |
| *G01R 31/26* | (2020.01) |
| *H01L 33/00* | (2010.01) |
| *G09G 3/32* | (2016.01) |
| *H01L 25/075* | (2006.01) |
| *H01L 33/50* | (2010.01) |

(52) U.S. Cl.
CPC ...... *H01L 21/67144* (2013.01); *H01L 25/167* (2013.01); *H01L 27/124* (2013.01); *H01L 27/1248* (2013.01); *H01L 27/1255* (2013.01); *H01L 27/1259* (2013.01); *H01L 27/1262* (2013.01); *H01L 33/0093* (2020.05); *H01L 33/38* (2013.01); *H01L 33/62* (2013.01); *G09G 3/32* (2013.01); *G09G 2300/0426* (2013.01); *H01L 22/14* (2013.01); *H01L 25/0753* (2013.01); *H01L 33/50* (2013.01); *H01L 2933/0066* (2013.01)

DISPLAY DEVICE

CROSS REFERENCE TO RELATED APPLICATIONS

This application is a Continuation of application Ser. No. 16/244,484, filed Jan. 10, 2019 (now U.S. Pat. No. 11,004, 753), which is a Continuation of application Ser. No. 15/617, 191, filed Jun. 8, 2017 (now U.S. Pat. No. 10,217,678, issued on Feb. 26, 2019), which claims the benefit of U.S. Provisional Application No. 62/350,169, filed Jun. 14, 2016, U.S. Provisional Application No. 62/355,392, filed Jun. 28, 2016, U.S. Provisional Application No. 62/361,543, filed Jul. 13, 2016, and U.S. Provisional Application No. 62/394,225, filed Sep. 14, 2016, and claims priority of China Patent Application No. 201710103986.9, filed Feb. 24, 2017, the entirety of which are incorporated by reference herein.

BACKGROUND OF THE INVENTION

Field of the Invention

The invention relates to display devices, and in particular to a display device with light-emitting elements.

Description of the Related Art

As digital technology develops, display devices are being used more widely in many aspects of daily life, such as in televisions, notebook computers, computers, cell phones, smartphones, and other modern information devices. Also, display devices are continuously being developed to be lighter, thinner, smaller and more fashionable than previous generations. These display devices include light-emitting diode display devices.

Light-emitting diodes (LEDs) generate electromagnetic radiation (for example, light) by applying the recombination of an electron-hole pair in a p-n junction. In a forward bias p-n junction formed of direct band gap material such as GaAs or GaN, electromagnetic radiation is generated by the recombination of electron-hole pairs pouring into a depletion region. The electromagnetic radiation may be in the visible light region or the invisible light region, and LEDs of different colors are formed of materials with different energy gaps.

Nowadays, LEDs for the display device industry are trending towards mass production, and any reduction in the production cost of LED display devices may bring a significant beneficial economic effect. However, existing display devices are not satisfactory in every aspect.

Therefore, a display device that can increase display quality or reduce the production cost is still required in the industry.

BRIEF SUMMARY OF THE INVENTION

Some embodiments of the disclosure provide a display device, including: a substrate, a light-emitting element, and a transistor. The substrate has a top surface. The light-emitting element is disposed on the substrate, and includes a first electrode and a second electrode. The transistor is disposed on the substrate and electrically connected to the light-emitting element. The transistor includes a gate electrode and a semiconductor layer. The semiconductor layer includes an overlapping portion overlapped with the gate electrode. The first electrode and the second electrode of the light-emitting element do not overlap with the overlapping portion along a direction perpendicular to the top surface of the substrate.

To clarify the features and advantages of the present disclosure, a detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIG. 1C-2 is a cross-sectional view of a display device in accordance with some other embodiments.

FIGS. 13D-1 and 13D-2 are top views of a display device in accordance with some other embodiments.

FIGS. 13E-1 and 13E-2 are top views of a display device in accordance with some other embodiments.

DETAILED DESCRIPTION OF THE INVENTION

Figure 1A:
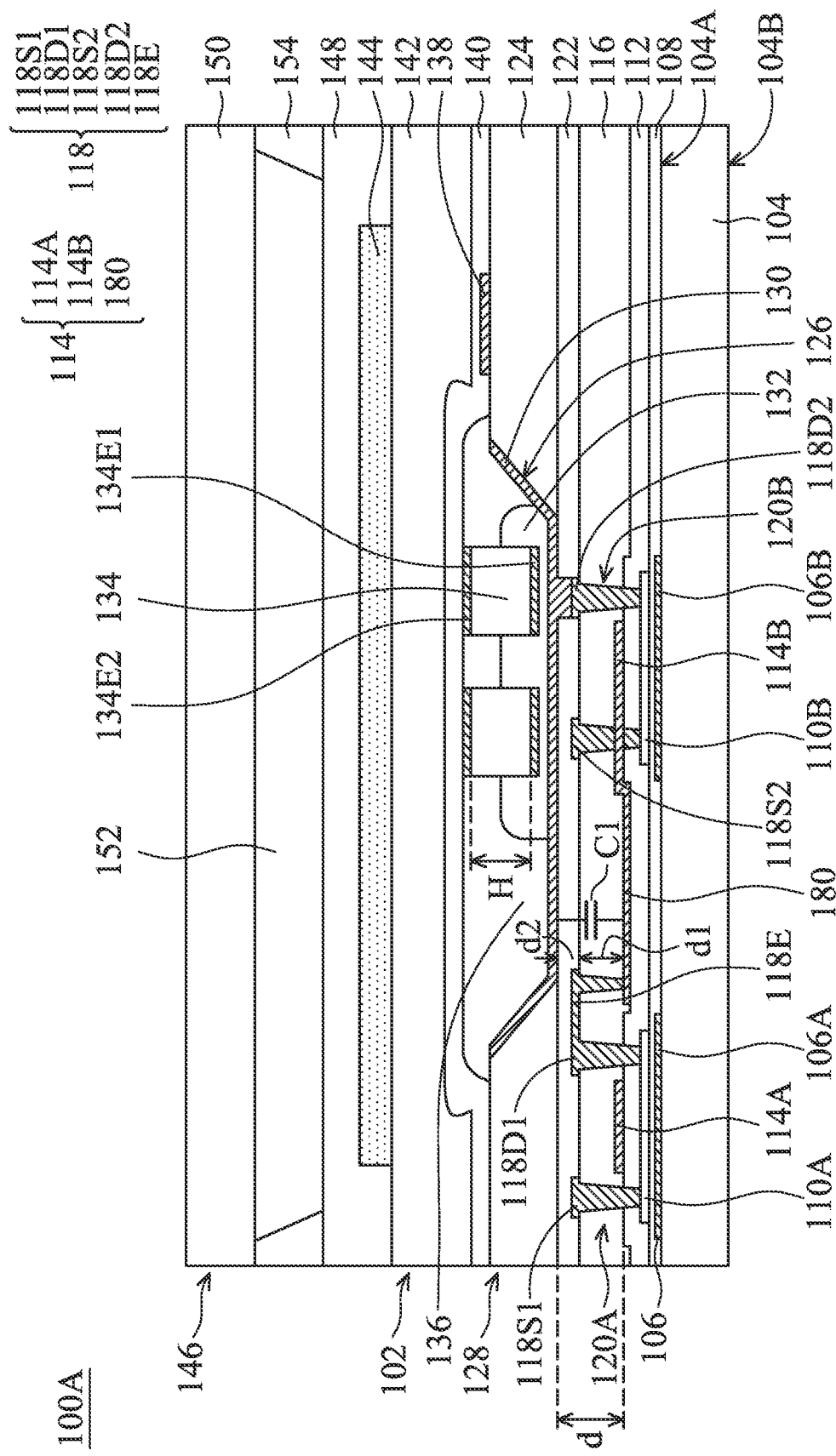
FIG. 1A is a cross-sectional view of a display device in accordance with some embodiments.

The substrates, the display devices and the methods for manufacturing the display device of the present disclosure in accordance with some embodiments are described in detail in the following description. It should be appreciated that in the following detailed description provides various embodiments and examples in order to perform various configurations of some embodiments of the present disclosure. The specific elements and configurations described in the following detailed description are set forth in order to clearly describe some embodiments of the present disclosure. It will be apparent that the exemplary embodiments set forth herein are used merely for the purpose of illustration, and the inventive concept may be embodied in various forms without being limited to those exemplary embodiments. In addition, the drawings of different embodiments may use repeated numerals or marks. Those repetitions are merely in order to clearly describe some embodiments of the present disclosure. However, the use of repeated numerals in the drawings of different embodiments does not suggest any correlation between different embodiments and/or configurations. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions may be used. For example, "lower", "bottom", "higher" or "top" are used to describe the position of one element relative to another. It should be appreciated that if a device is flipped upside down, an element that is "lower" will become an element that is "higher".

The terms "about", "substantially" and "approximately" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about", "substantially", or "approximately".

It should be understood that, although the terms "first", "second", "third" etc. may be used herein to describe various elements, components, regions, layers and/or portions, and these elements, components, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure.

Unless defined otherwise, all the terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

This description of the exemplary embodiments is intended to be read in connection with the accompanying drawings, which are to be considered part of the entire written description. It should be appreciated that the drawings are not drawn to scale. The shape and the thickness of embodiments may be exaggerated in the drawings to clarify the features of the present disclosure. In addition, structures and devices are shown schematically in order to clarify the features of the present disclosure.

In some embodiments of the present disclosure, relative terms such as "downwards," "upwards," "horizontal," "vertical,", "below," "above," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are in contact with one another either directly or indirectly, wherein there are other structures disposed between both the structures, unless expressly described otherwise. These relative terms also include the relationships wherein both structures are movable or rigid attachments.

It should be noted that, the term "substrate" is meant to include elements formed on a transparent substrate and the layers overlying the transparent substrate. However, the substrate is represented with a flat surface in order to simplify the drawing. In addition, the term "substrate surface" is meant to include the uppermost exposed layers on a transparent substrate, such as an insulating layer and/or metallic lines.

Some embodiments of the disclosure utilize a pixel electrode disposed on a transistor layer in a display device and a conductive connection portion in the transistor layer to form a capacitor in order to increase the display quality of the display device.

First, referring to FIG. 1A, FIG. 1A is a cross-sectional view of a display device 100A in accordance with some embodiments. The display device 100A includes a substrate 104, wherein the substrate 104 has opposite top surface 104A and bottom surface 104B. The substrate 104 may include transparent substrate, for example, glass substrate, ceramic substrate, plastic substrate, or any other suitable substrate.

Referring to FIG. 1A, in some embodiments, a patterned bottom conductive layer 106 is disposed on the top surface 104A of the substrate 104. The patterned bottom conductive layer 106 includes a first block 106A and a second block 106B disposed corresponding to the two subsequent transistors, respectively.

In some embodiments, the material of the patterned bottom conductive layer 106 may include Cu, Al, Mo, W, Au, Cr, Ni, Pt, Ti, Ir, Rh, an alloy thereof, a combination thereof, or another metal material with good conductivity. In other embodiments, the patterned bottom conductive layer 106 may be a non-metal material, as long as the material used has conductivity. The material of the patterned bottom conductive layer 106 may be formed by chemical vapor deposition (CVD), sputtering, resistance heating evaporation, electron beam evaporation, or any other suitable deposition method. In some embodiments, the CVD may be, for example, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or another commonly used method.

Referring to FIG. 1A, a buffer layer 108 is disposed on the patterned bottom conductive layer 106 and the substrate 104. In some embodiments, the buffer layer 108 may be silicon oxide, silicon nitride, silicon oxynitride, or any other suitable insulating material. In some embodiments, the buffer layer 108 may be formed by the aforementioned CVD, spin-on coating, or any other suitable method.

Referring to FIG. 1A, a semiconductor layer 110A is disposed on the buffer layer 108. The semiconductor layer 110A is disposed corresponding to the first block 106A of the patterned bottom conductive layer 106. In addition, another semiconductor layer 110B is disposed on the buffer layer 108. The semiconductor layer 110B is disposed corresponding to the second block 106B of the patterned bottom conductive layer 106.

In some embodiments, The semiconductor layer 110A and/or the semiconductor layer 110B may include elemental semiconductors including silicon and germanium, compound semiconductors including gallium nitride (GaN), silicon carbide, gallium arsenide, gallium phosphide, indium phosphide, indium arsenide and/or indium antimonide, alloy semiconductors including SiGe, GaAsP, AlInAs, AlGaAs, GaInAs, GaInP and/or GaInAsP, combinations thereof, or any other suitable material. In some embodiments, the semiconductor layer 110A and/or the semiconductor layer 110B may be formed by epitaxial method, the aforementioned CVD, or any other suitable method.

Referring to FIG. 1A, a gate dielectric layer 112 is disposed on the semiconductor layer 110A and/or the semiconductor layer 110B. In some embodiments, the gate dielectric layer 112 may be silicon oxide, silicon nitride, silicon oxynitride, high-k dielectric materials, any other suitable dielectric material, or a combination thereof. The high-k dielectric materials may be metal oxide, metal nitride, metal silicide, transition metal oxide, transition metal nitride, transition metal silicide, metal oxynitride, metal aluminate, zirconium silicate, zirconium aluminate.

For example, the high-k dielectric materials may be LaO, AlO, ZrO, TiO, $Ta_2O_5$, $Y_2O_3$, $SrTiO_3$ (STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$ (BST), $Al_2O_3$, another suitable high-k dielectric material, or a combination thereof. The gate dielectric layer 112 may be formed by the aforementioned CVD, spin-on coating, or any other suitable method.

Referring to FIG. 1A, a first patterned conductive layer 114 is disposed on the semiconductor layers 110A and 110B, or on the gate dielectric layer 112. In some embodiments, the first patterned conductive layer 114 includes a gate electrode 114A and another gate electrode 114B disposed respectively corresponding to the semiconductor layer 110A and the semiconductor layer 110B. In addition, as shown in FIG. 1A, the first patterned conductive layer 114 may further include a conductive connection portion 180 disposed between the gate electrode 114A and the gate electrode 114B, and connected to the gate electrode 114B in accordance with some embodiments, wherein the conductive connection portion 180 and the gate electrode 114B are in the same layer. Therefore, the conductive connection portion 180 and the gate electrode 114B belong to the first patterned conductive layer 114 and are formed by the same photolithography process used for patterning.

However, the structure of the embodiments of the disclosure is not limited to FIG. 1A. In some other embodiments, the first patterned conductive layer 114 may also be disposed between the semiconductor layers 110A and the substrate 104, and between the semiconductor layer 110B and the substrate 104. In more detail, in some embodiments, the first patterned conductive layer 114 may be disposed between the semiconductor layer 110A and the buffer layer 108, and between the semiconductor layer 110B and the buffer layer 108. In addition, in the embodiment, the gate dielectric layer 112 is disposed between the gate electrode 114A and the semiconductor layer 110A, and between the gate electrode 114B and the semiconductor layer 110B.

Referring to FIG. 1A, a first insulating layer 116 covers the first patterned conductive layer 114 and the gate dielectric layer 112. In some embodiments, the first insulating layer 116 may be silicon nitride, silicon dioxide, silicon oxynitride, or any other suitable insulating material. In some embodiments, the first insulating layer 116 may be formed by the aforementioned CVD, spin-on coating, or any other suitable method.

Referring to FIG. 1A, a second patterned conductive layer 118 is disposed on the first insulating layer 116 (or on the first patterned conductive layer 114). In some embodiments, the second patterned conductive layer 118 includes a source electrode 118S1 and a drain electrode 118D1. The source electrode 118S1 and the drain electrode 118D1 are disposed on the opposite sides of the semiconductor layer 110A and electrically connected to both ends of the semiconductor layer 110A, respectively.

Referring to FIG. 1A, in some embodiments, the second patterned conductive layer 118 further includes a source electrode 118S2 and a drain electrode 118D2. The source electrode 118S2 and the drain electrode 118D2 are disposed on the opposite sides of the semiconductor layer 110B and electrically connected to both ends of the semiconductor layer 110B, respectively.

Moreover, as shown in FIG. 1A, the second patterned conductive layer 118 further includes a second extension portion 118E. The drain electrode 118D1 may be electrically connected to the conductive connection portion 180 of the first patterned conductive layer 114 and the gate electrode 114B through the second extension portion 118E in accordance with some embodiments.

In some embodiments, the semiconductor layer 110A, the gate electrode 114A, the source electrode 118S1 and the drain electrode 118D1 are combined as a first transistor 120A. In some embodiments, the semiconductor layer 110B, the gate electrode 114B, the source electrode 118S2 and the drain electrode 118D2 are combined as a second transistor 120B.

Referring to FIG. 1A, a second insulating layer 122 covers the first insulating layer 116 and the second patterned conductive layer 118. In some embodiments, the second insulating layer 122 may be silicon nitride, silicon dioxide, silicon oxynitride, or any other suitable insulating material. In some embodiments, the second insulating layer 122 may be formed by the aforementioned CVD, spin-on coating, or any other suitable method.

Referring to FIG. 1A, a third insulating layer 124 covers the second insulating layer 122. In some embodiments, the third insulating layer 124 may be silicon nitride, silicon dioxide, silicon oxynitride, or any other suitable organic or inorganic insulating material. In some embodiments, the third insulating layer 124 may be formed by the aforementioned CVD, spin-on coating, or any other suitable method.

Referring to FIG. 1A, in some embodiments, a pixel electrode 130 is disposed on the third insulating layer 124. In some embodiments, the semiconductor layer 110A, the semiconductor layer 110B, the gate dielectric layer 112, the gate electrode 114A, the gate electrode 114B, the first insulating layer 116, the source electrode 118S1, the drain electrode 118D1, the source electrode 118S2, the drain electrode 118D2, the second insulating layer 122 and the third insulating layer 124 are combined as first transistors 120A and second transistors 120B, and the first transistors 120A and the second transistors 120B are combined as a transistor layer 128. In some embodiments, referring to FIG. 1A, the top surface of the second transistor 120B has a recess 126.

Referring to FIG. 1A, a pixel electrode 130 is conformally disposed in the recess 126. As shown in FIG. 1A, the pixel electrode 130 is conformally disposed on the top surface of the recess 126 and electrically connected to the drain electrode 118D2 in accordance with some embodiments.

In some embodiments, the material of the pixel electrode 130 may be Cu, Al, Mo, W, Au, Cr, Ni, Pt, Ti, Ir, Rh, an alloy thereof, a combination thereof, or another metal material with good conductivity, or transparent conductive materials, for example, indium tin oxide (ITO), SnO, indium zinc oxide (IZO), indium gallium zinc oxide (IGZO), indium tin zinc oxide (ITZO), antimony tin oxide (ATO), antimony oxide zinc (AZO), combinations thereof, or any other suitable transparent conductive oxide material. In other embodiments, the material of the pixel electrode 130 may be a non-metal material, as long as the material used has conductivity. The material of the pixel electrode 130 may be formed by the aforementioned CVD, sputtering, resistance heating evaporation, electron beam evaporation, or any other suitable deposition method In some embodiments, the pixel electrode 130 and the conductive connection portion 180 can form a capacitor. For example, as shown in FIG. 1A, the conductive connection portion 180 of the first patterned conductive layer 114 is electrically isolated from the pixel electrode 130, and the pixel electrode 130 and the conductive connection portion 180 form a first capacitor C1, wherein the capacitor C1 has an equivalent permittivity $\varepsilon$ and a thickness d. When the conductive connection portion 180 and the gate electrode 114B of the second transistor 120B are in the same layer, and an insulating layer between the conductive connection portion 180 and the pixel electrode 130 further includes the first insulating layer 116 and the second insulating layer 122, the thickness and the equivalent permittivity of the first insulating layer 116 are respectively d1 and ε1, the thickness and the equivalent permittivity of the second insulating layer 122 are respectively d2 and ε2. The thickness d of the capacitor C1 is equivalent to the thickness d1 of the first insulating layer plus the thickness d2 of the second insulating layer. Therefore, the capacitor C1 is equivalent to the capacitor of the first insulating layer 116 serially connected to the capacitor of the second insulating layer 122. Thus, after normalized the area of the capacitor C1, which is equivalent to a ratio of the equivalent permittivity ε and the thickness d. In some embodiments, the capacitance of the capacitor C1 may be represented by the following Formula 1.

$$C1 = \frac{\varepsilon}{d} = \frac{1}{\frac{1}{\frac{\varepsilon 1}{d1}} + \frac{1}{\frac{\varepsilon 2}{d2}}} \quad \text{Formula 1}$$

unit $(1E+5)F/m^2$ $\varepsilon$: the equivalent permittivity of $C1$ $\varepsilon 1$: the equivalent permittivity of the first insulating layer $\varepsilon 2$: the equivalent permittivity of the second insulating layer $d$: the thickness of $C1$ $d1$: the thickness of the first insulating layer $d2$: the thickness of the second insulating layer In some embodiments, the unit of Formula 1 is $(1E+5)F/m^2$. In some embodiments, the ε in Formula 1 is the equivalent permittivity of the capacitor C1. The ε1 in Formula 1 is the equivalent permittivity of the first insulating layer. The ε2 in Formula 1 is the equivalent permittivity of the second insulating layer. The d in Formula 1 is the thickness of the capacitor C1. The d1 in Formula 1 is the thickness of the first insulating layer. The d2 in Formula 1 is the thickness of the second insulating layer. The insulating layer between the conductive connection portion 180 and the pixel electrode 130 may be single-layer or multi-layer. The capacitor C1 in the embodiment is multi-layer. Referring to Table 1 and 2, the ratio of the equivalent permittivity ε and the thickness d of the capacitor C1 is in a range from $0.4*(1E+5)F/m^2$ to $296.48*(1E+5)F/m^2$. When the conductive connection portion 180 and the gate electrode 114B of the second transistor 120B are in the same layer, the ratio of the equivalent permittivity ε and the thickness d of the capacitor C1 is in a range from $0.4*(1E+5)F/m^2$ to $88.5*(1E+5)F/m^2$.

TABLE 1

| A capacitor C1, and the insulating layer is multi-layer | | First insulating layer | Second insulating layer | Organic material layer |
|---|---|---|---|---|
| ε | | 3.7~4.5 | 3.7~7.2 | 2.7~4.2 |
| d (Å) | | 200~5000 | 200~5000 | 5000~50000 |

TABLE 1-continued

| A capacitor C1, and the insulating layer is multi-layer | | First insulating layer | Second insulating layer | Organic material layer |
|---|---|---|---|---|
| $(\varepsilon/d) * (1E+5)F/m^2$ | Max | | 88.5 | |
| | Min | | 0.4 | |

TABLE 2

| A capacitor C2, and the insulating layer is single-layer | | First insulating layer | Organic material layer |
|---|---|---|---|
| ε | | 3.7~4.5 | 2.7~4.2 |
| d (Å) | | 200~5000 | 5000~50000 |
| $(\varepsilon/d) * (1E+5)F/m^2$ | Max | 296.48 | |
| | Min | 0.45 | |

Therefore, in some embodiments, when the first insulating layer is SiOx material, the thickness d1 of the first insulating layer is in a range from 200 Å to 5000 Å, and the second insulating layer is SiNx material, the thickness d2 of the second insulating layer is in a range from 200 Å to 5000 Å, the above-mentioned range of the ratio may be obtained. Furthermore, when one of the first insulating layer and the second insulating layer may be made of organic material, or there is a planarization layer (PFA) made of organic material covering the first insulating layer and the second insulating layer, the above-mentioned range of the ratio may also be obtained.

In some embodiments, the display quality of the display device 100A may be increased by utilizing the first patterned conductive layer 114 and the pixel electrode 130 disposed on the substrate 104 in the display device 100A to form a capacitor.

Referring to FIG. 1A, an anisotropic conductive film (ACF) 132 is disposed in the recess 126 of the third insulating layer 124 and on the pixel electrode 130. In some embodiments, the ACF 132 is a thermo-curing resin film or an UV-curing resin film with conductive particles. In some embodiments, the conductive particles may be nanoparticles, nanorods, nanowires, nanosheets, or any other suitable material. In some embodiments, the shape of the conductive particles may be square, triangle, circle, or any other suitable shape. In some embodiments, the material of the conductive particles may be Ag, Au, Cu, Al, Mo, W, Cr, Ni, Pt, Ti, Ir, Rh, an alloy thereof, a combination thereof, or another metal material with good conductivity.

Referring to FIG. 1A, a light-emitting element 134 is disposed on the pixel electrode 130 in the recess 126 and electrically connected to the pixel electrode 130 and the drain electrode 118D2. In more detail, as shown in FIG. 1A, the light-emitting element 134 includes an electrode 134E1 and another electrode 134E2 respectively disposed on the bottom and top surfaces of the light-emitting element 134. The electrode 134E1 is disposed in the ACF 132 and electrically connected to the pixel electrode 130 and the drain electrode 118D1 through the ACF 132. In some embodiments, the electrode 134E2 is not disposed in the ACF 132.

In some embodiments, the thickness H of the light-emitting element 134 is equivalent to the distance between the top surface and the bottom surface of the light-emitting element 134, which is the thickness of the light-emitting element 134 after subtracting that of the electrodes 134E1 and 134E2. The thickness H of the light-emitting element 134 is in a range from about 2 μm to about 12 μm. In some embodiments, the thickness H of the light-emitting element 134 may be in a range from about 3 μm to about 10 μm.

In some embodiments, the light-emitting element 134 includes light-emitting diodes (LEDs), for example, red light LEDs, blue light LEDs, green light LEDs, UV-LEDs, white LEDs, or any other suitable LED.

Referring to FIG. 1A, an insulating layer 136 fills into the recess 126. In some embodiments, the insulating layer 136 may further extend on the recess 126 and cover a portion of the third insulating layer 124. As shown in FIG. 1A, the insulating layer 136 covers the pixel electrode 130 in accordance with some embodiments. In addition, in some embodiments, the insulating layer 136 surrounds the light-emitting element 134 and exposes the electrode 134E2 of the light-emitting element 134.

Referring to FIG. 1A, a third patterned conductive layer 138 is disposed on the third insulating layer 124 (or on the top surface of the transistor layer 128). In some embodiment, the third patterned conductive layer 138 may be connected to ground. However, in other embodiments, the third patterned conductive layer 138 may not be connected to ground, and may transfer signals.

In some embodiments, the material of the third patterned conductive layer 138 may include Cu, Al, Mo, W, Au, Cr, Ni, Pt, Ti, Ir, Rh, an alloy thereof, a combination thereof, or another metal material with good conductivity. In other embodiments, the material of the third patterned conductive layer 138 may be a non-metal material, as long as the material used has conductivity. In some embodiments, the material of the third patterned conductive layer 138 may be formed by the aforementioned CVD, sputtering deposition, resistance heating evaporation, electron beam evaporation, or any other suitable deposition method.

Referring to FIG. 1A, in some embodiments, a top electrode layer 140 covers the third insulating layer 124, the electrode 134E2 of the light-emitting element 134, the insulating layer 136 and the third patterned conductive layer 138. In some embodiments, the top electrode layer 140 may be electrically connected to the third patterned conductive layer 138 and the electrode 134E2 of the light-emitting element 134.

In some embodiments, the material of the top electrode layer 140 may include transparent conductive materials, for example, ITO, SnO, IZO, IGZO, ITZO, ATO, AZO, combinations thereof, or any other suitable transparent conductive oxide material. In some embodiments, the material of the top electrode layer 140 may be formed by the aforementioned CVD, sputtering deposition, resistance heating evaporation, electron beam evaporation, or any other suitable deposition method.

Referring to FIG. 1A, in some embodiments, a light guiding layer 142 covers the top electrode layer 140, and a light conversion layer 144 disposed on the light guiding layer 142. In some embodiments, the light conversion layer 144 is disposed corresponding to the light-emitting element 134.

In some embodiments, the light conversion layer 144 may be a fluorescent layer 144. In some embodiments, the light emitted by the light-emitting element 134 generates white light after passing through the fluorescent layer 144. The white light may generate light of different colors through a subsequent color filter layer. The material of the fluorescent layer 144 may be aluminate, silicate, nitride, oxynitride, combinations thereof, or any other suitable fluorescent material.

In some embodiments, the light conversion layer 144 may be a quantum dots film 144. The material of the quantum dots film 144 may include an organic or inorganic layer doped with quantum dots. The quantum dots are 3D nanostructures made of a component including Zn, Cd, Se, S, or a combination thereof. The diameter of the quantum dots is in a range from approximately 1 nm to 10 nm. Through adjusting the diameter of the quantum dots, the color of the light that generated by the quantum dots film 144 after excited by the light emitted from the light-emitting element 134 (e.g. blue light of wavelength between 380-500 nm) may be changed.

Referring to FIG. 1A, the display device 100A further includes a second substrate 146 disposed opposite the substrate 104, and a bonding layer 148 disposed between the substrate 104 and the second substrate 146. The material of the bonding layer may be, for example, an optical clear adhesive. In some embodiments, the bonding layer 148 may bond the substrate 104 and the second substrate 146.

In some embodiments, the second substrate 146 is a color filter substrate. In more detail, the second substrate 146 which is a color filter substrate may include a substrate 150, and a color filter layer 152 disposed on the substrate 150. In addition, in some embodiments, a light-shielding layer 154 is disposed on the sides of the color filter layer 152.

In some embodiments, the substrate 150 may include transparent substrate, for example, glass substrate, ceramic substrate, plastic substrate, or any other suitable substrate. The color filter layer 152 may include a red color filter layer, a green color filter layer, a blue color filter layer or any other suitable color filter layer. The light-shielding layer 154 may include black photoresist, black printing ink, or black resin.

Figure 1B:
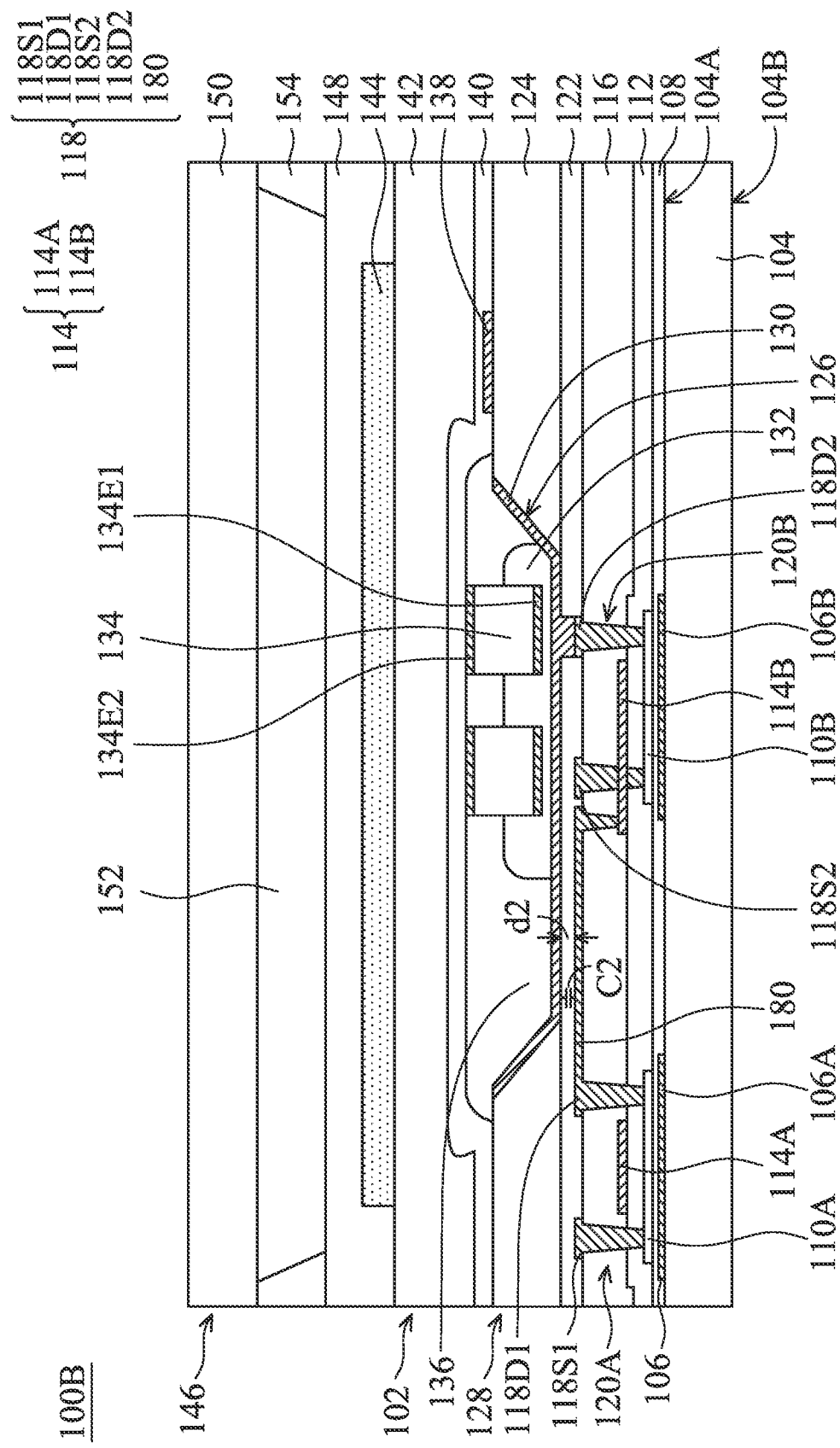
FIG. 1B is a cross-sectional view of a display device in accordance with some other embodiments.

Referring to FIG. 1B, FIG. 1B is a cross-sectional view of a display device 100B in accordance with some other embodiments. In the embodiments, the conductive connection portion 180 of the second patterned conductive layer 118 is electrically isolated from the pixel electrode 130, wherein the conductive connection portion 180 and the source electrode 118S2 of the second transistor 120B are in the same layer. The conductive connection portion 180 and the pixel electrode 130 form a second capacitor C2, wherein the capacitor C2 has an equivalent permittivity ($\varepsilon r^*\varepsilon 0$) and a thickness d2. Referring to the aforementioned Table 2, the capacitance of the capacitor C2 is equivalent to the capacitance of a capacitor that consists of the first insulating layer 116. Accordingly, after normalized the area of the capacitor C2, the ratio of the equivalent permittivity to the thickness is in a range from $0.45*(1E+5)F/m^2$ to $296.48*(1E+5)F/m^2$.

Figures 1, 1C:
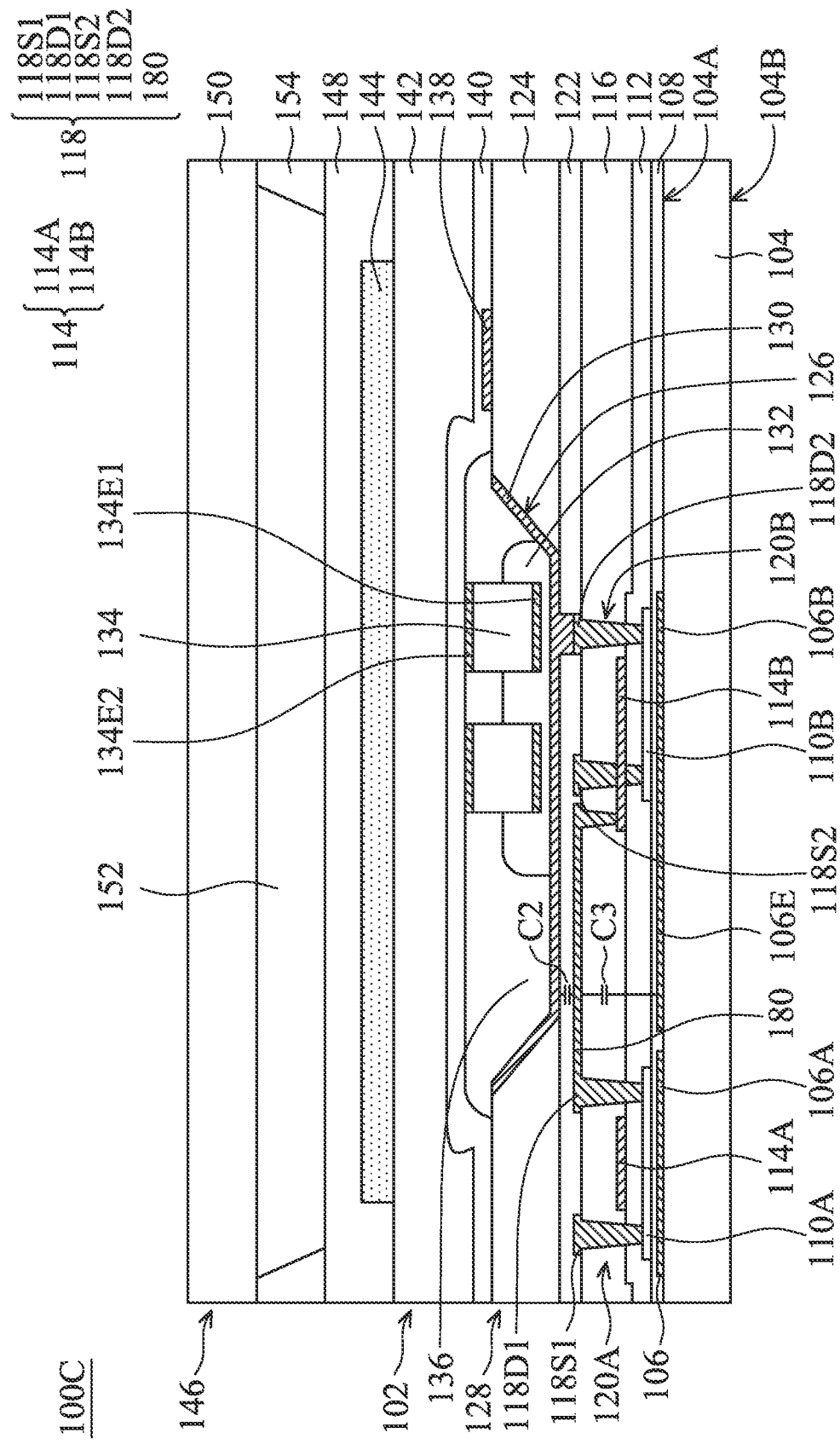
FIG. 1C-1 is a cross-sectional view of a display device in accordance with some other embodiments.

Furthermore, as shown in FIG. 1C-1, the patterned bottom conductive layer 106 disposed below the first patterned conductive layer 114 and the second patterned conductive layer 118 further includes an auxiliary electrode 106E in accordance with some embodiments. The auxiliary electrode 106E is disposed between the substrate 104 and the conductive connection portion 180, and the auxiliary electrode 106E is at least partially overlapped with the conductive connection portion 180 and electrically connected to the second block 106B of the patterned bottom conductive layer 106. In some embodiments, the auxiliary electrode 106E is electrically isolated from the conductive connection portion 180, and the auxiliary electrode 106E and the conductive connection portion 180 form a third capacitor C3.

Figures 1, 1C, 2:
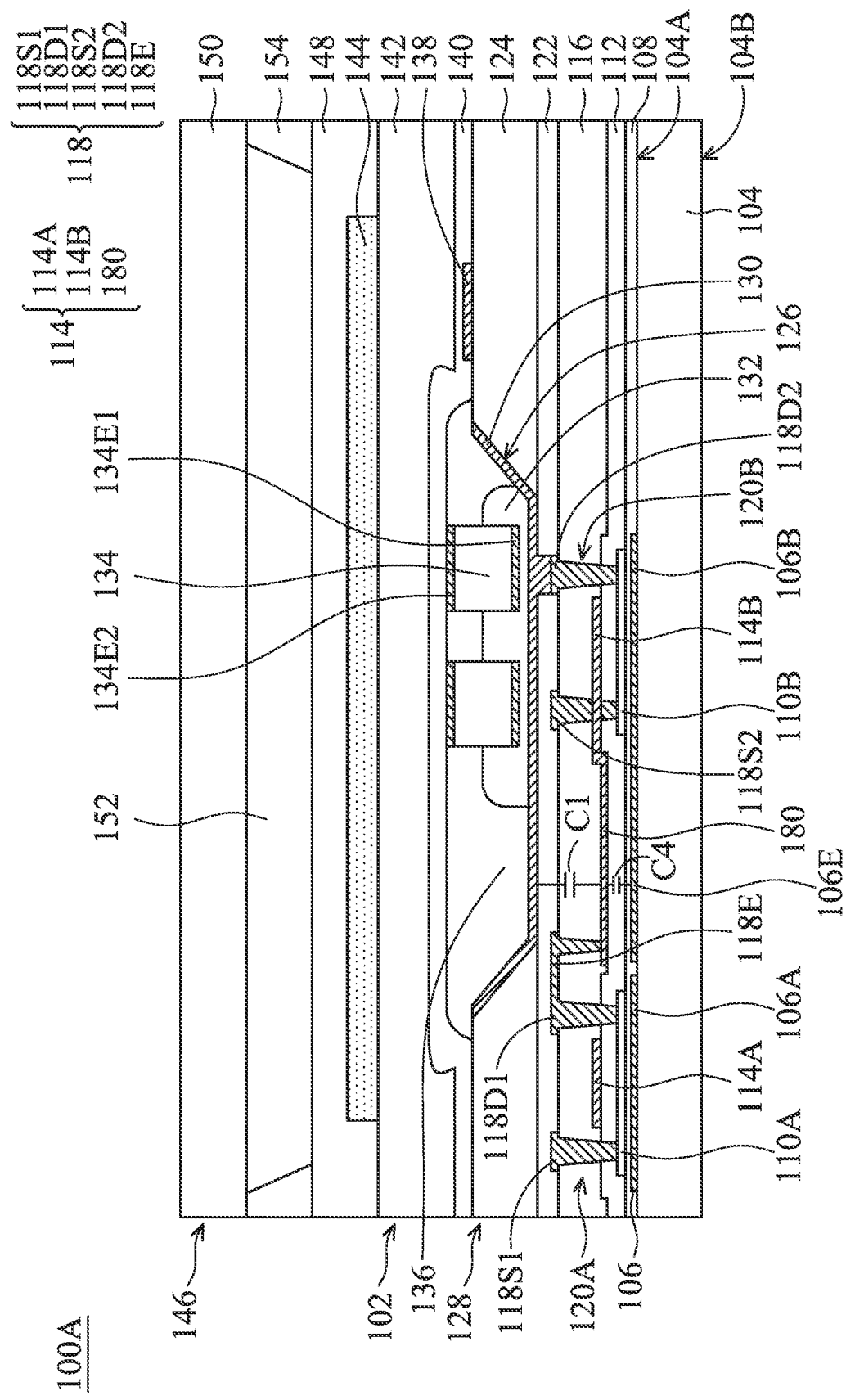

In addition, as shown in FIG. 1C-2, in some other embodiments, when the conductive connection portion 180 and the gate electrode 114B of the second transistor 120B are in the same layer, and the auxiliary electrode 106E is disposed between the substrate 104 and the conductive connection portion 180, the auxiliary electrode 106E is at least partially overlapped with the conductive connection portion 180. The auxiliary electrode 106E and the conductive connection portion 180 form a fourth capacitor C4.

Figure 1D:
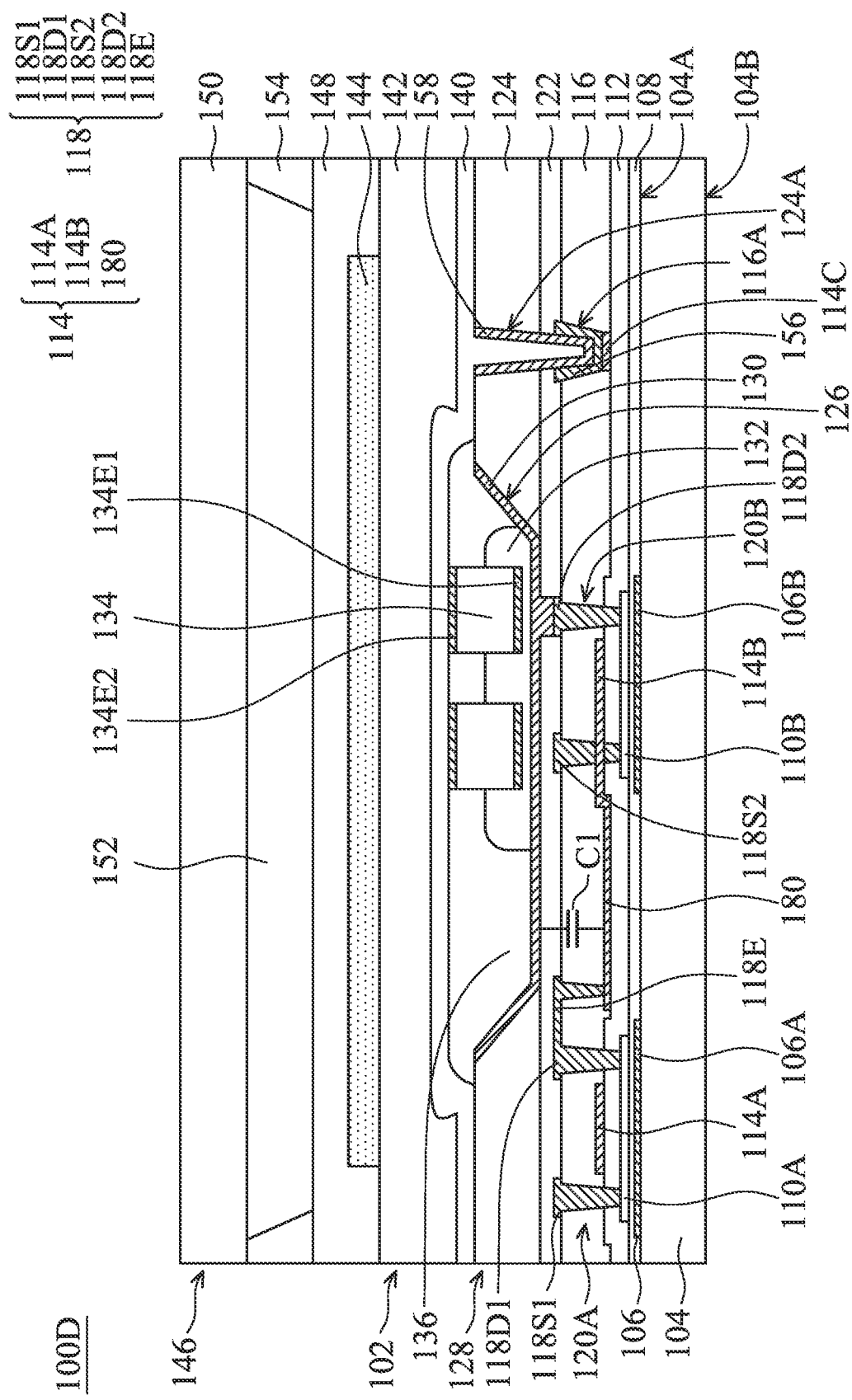
FIG. 1D is a cross-sectional view of a display device in accordance with some other embodiments.

Referring to FIG. 1D, FIG. 1D is a cross-sectional view of a display device 100D in accordance with some other embodiments. As shown in FIG. 1D, the top electrode layer 140 is connected to ground through the first patterned conductive layer 114 in accordance with other embodiments. In more detail, the first patterned conductive layer 114 further includes a conductive block 114C connected to ground. Referring to FIG. 1D, the first insulating layer 116 includes an opening 116A exposing the conductive block 114C, and a conductive layer 156 is disposed in the opening 116A.

Referring to FIG. 1D, the second insulating layer 122 and the third insulating layer 124 include an opening 124A exposing the conductive layer 156, and a conductive layer 158 is disposed in the opening 124A. In some embodiments, the top electrode layer 140 fills into the opening 124A and is connected to ground through the conductive layer 158, the conductive layer 156 and the conductive block 114C. In the embodiments, the opening 116A is aligned with the opening 124A.

In some embodiments, the materials of the conductive layer 158, the conductive layer 156 and the conductive block 114C may individually include Cu, Al, Mo, W, Au, Cr, Ni, Pt, Ti, Ir, Rh, an alloy thereof, a combination thereof, or another metal material with good conductivity. In some other embodiments, the materials of the conductive layer 158, the conductive layer 156 and the conductive block 114C may individually be a non-metal material, as long as the material used has conductivity. The materials of the conductive layer 158, the conductive layer 156 and the conductive block 114C may individually be formed by the aforementioned CVD, sputtering, resistance heating evaporation, electron beam evaporation, or any other suitable deposition method.

Figure 1E:
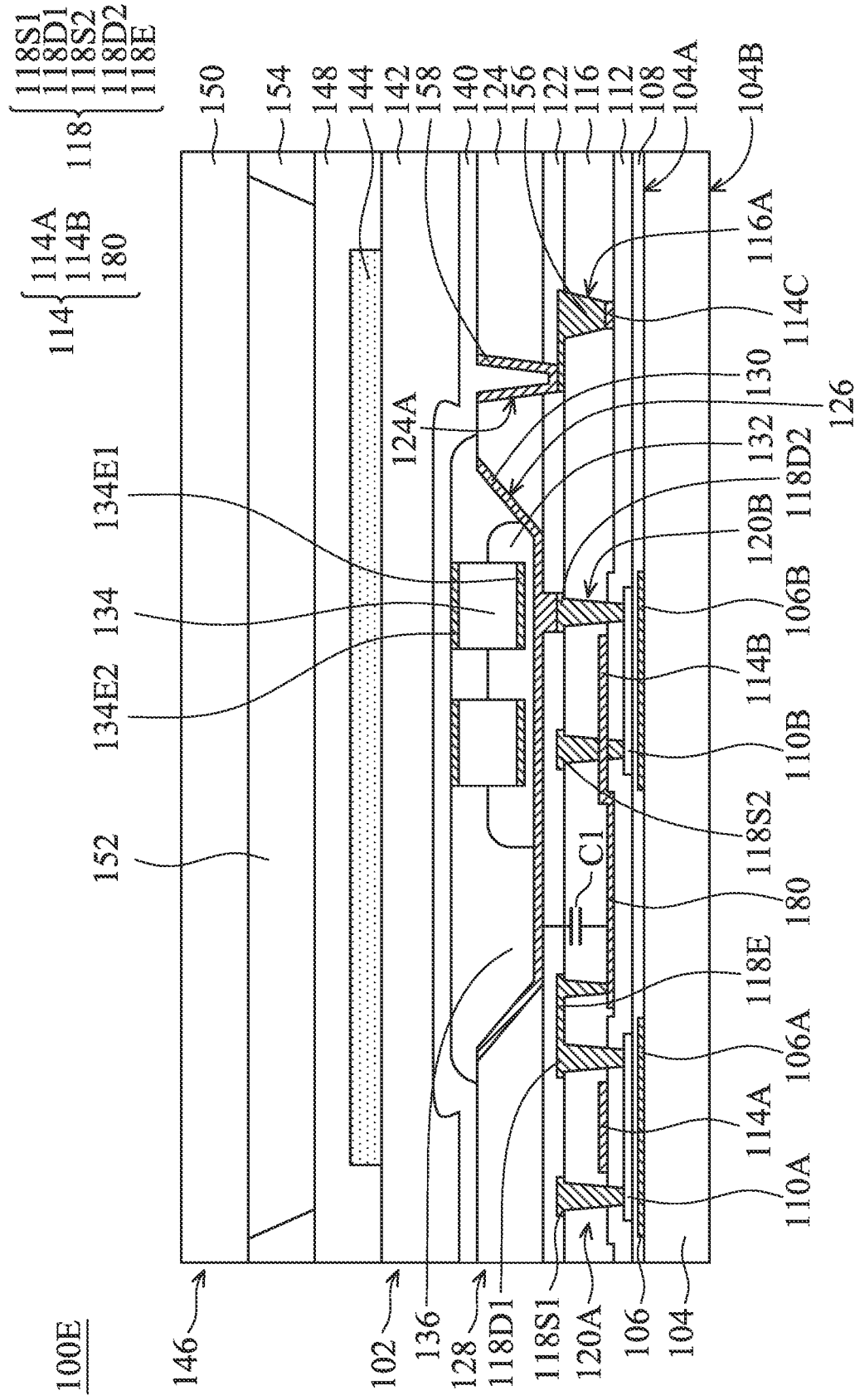
FIG. 1E is a cross-sectional view of a display device in accordance with some other embodiments.

Referring to FIG. 1E, FIG. 1E is a cross-sectional view of a display device 100E in accordance with some other embodiments. As shown in FIG. 1E, the opening 116A is not aligned with the opening 124A, and the conductive layer 156 fully fills into the opening 116A in accordance with other embodiments. In some embodiments, the top electrode layer 140 fills into the opening 124A and is connected to ground through the conductive layer 158, the conductive layer 156 and the conductive block 114C.

Figure 1F:
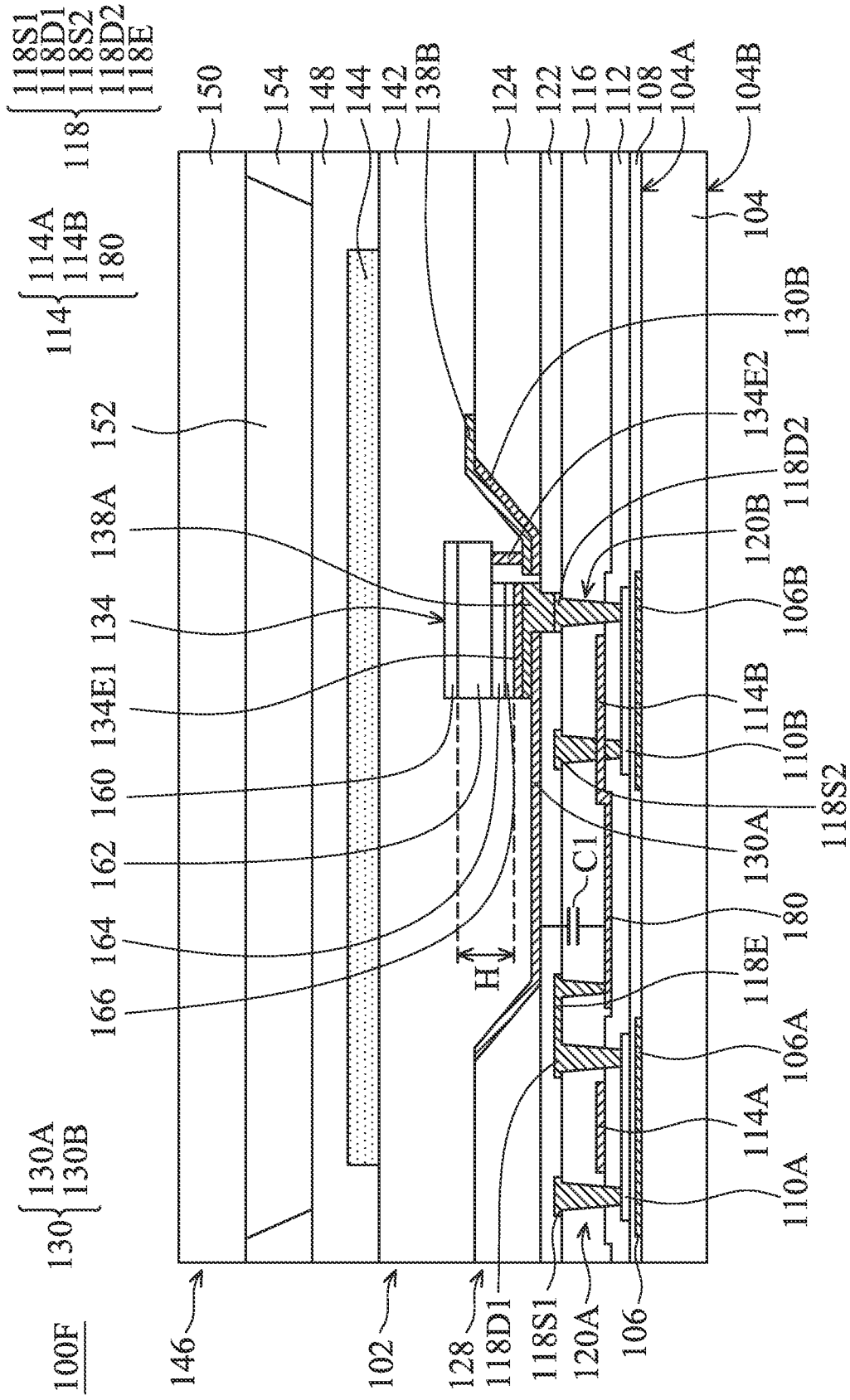
FIG. 1F is a cross-sectional view of a display device in accordance with some other embodiments.

Referring to FIG. 1F, FIG. 1F is a cross-sectional view of a display device 100F in accordance with some other embodiments. As shown in FIG. 1F, the light-emitting element 134 may be a flip-chip LED 134. In some embodiments, the flip-chip LED 134 may include a substrate 160. A first semiconductor layer 162 is disposed on the substrate 160, and the first semiconductor layer 162 has a first conductive type. The first semiconductor layer 162 may include doped or undoped GaN, InN, AlN, $In_xGa_{(1-x)}$ N, $Al_xIn_{(1-x)}$ N, $Al_xIn_yGa_{(1-x-y)}$ N, or another similar material, wherein $0 \leq x \leq 1$, $0 \leq y \leq 1$, and $0 \leq (x+y) \leq 1$. The first semiconductor layer 162 may be a P-type semiconductor layer or an N-type semiconductor layer, and may be formed by molecular beam epitaxy (MBE), metal-organic chemical vapor deposition (MOCVD), hydride vapor phase epitaxy (HVPE), liquid phase epitaxy (LPE), or another similar epitaxial growth process.

Referring to FIG. 1F, an active layer 164 is disposed on the first semiconductor layer 162. The active layer 164 may include homojunction, heterojunction, single-quantum well (SQW), multiple-quantum well (MQW), or another similar structure. In an embodiment, the active layer 164 may include undoped N-type $In_xGa_{(1-x)}$ N. In other embodiments, the active layer 164 may include, for example, $Al_xIn_yGa_{(1-x-y)}$ N or another commonly used material. In other embodiments, the active layer 164 may be a multiple-quantum well structure including a staggered arrangement of multiple-quantum well layer (such as InGaN) and barrier layer (such as GaN). Moreover, the methods for forming the active layer 164 may include MOCVD, MBE, HVPE, LPE, or another suitable CVD method. The total thickness of the active layer 164 is in a range from approximately 5 nm to 400 nm.

Referring to FIG. 1F, a second semiconductor layer 166 is disposed on the active layer 164, and the second semiconductor layer 166 has a second conductive type, which is different from the first conductive type. The second semiconductor layer 166 may include doped or undoped GaN, InN, AlN, $In_xGa_{(1-x)}$ N, $Al_xIn_{(1-x)}$ N, $Al_xIn_yGa_{1-x-y}$ N, or another similar material, wherein $0 \leq x \leq 1$, $0 \leq y \leq 1$, and $0 \leq (x+y) \leq 1$. The second semiconductor layer 166 may be a P-type semiconductor layer or an N-type semiconductor layer, and may be formed by MBE, MOCVD, HVPE, LPE, or another similar epitaxial growth process.

Referring to FIG. 1F, the LED 134 may further include an electrode 134E2 and another electrode 134E1, wherein the electrode 134E2 is electrically connected to the first semiconductor layer 162, and the electrode 134E1 is electrically connected to the second semiconductor layer 166. In some embodiments, the electrode 134E2 and the electrode 134E1 may be a single-layer or multi-layer Au, Cr, Ni, Pt, Ti, Al, Ir, Rh, combinations thereof, or another metal material with good conductivity. The electrode 134E2 and the electrode 134E1 may be formed by a deposition and patterning process.

In some embodiments, the thickness H of the light-emitting element 134 is equivalent to the distance between the surface of the substrate 160 of the light-emitting element 134 and the surface of the second semiconductor layer 166, which is the thickness of the light-emitting element 134 after subtracting that of the electrode 134E1 and the electrode 134E2. The thickness H of the light-emitting element 134 is in a range from about 2 μm to about 12 μm. In some embodiments, the thickness H of the light-emitting element 134 is in a range from about 3 μm to about 10 μm.

Referring to FIG. 1F, in some embodiments, the pixel electrode 130 includes a first portion 130A and a second portion 130B electrically insulated from each other, and the third patterned conductive layer 138 includes an electrode 138A and another electrode 138B. The electrode 138A is disposed on the first portion 130A, and the electrode 138B is disposed on the second portion 130B. The electrode 138A is electrically connected to the drain electrode 118D2.

Referring to FIG. 1F, the electrode 138A of the third patterned conductive layer 138 is electrically connected to the electrode 134E1, and the electrode 138B is electrically connected to the electrode 134E2. The flip-chip LED 134 is attached to the transistor layer 128 through flip-chip method.

Figures 2A, 2B, 2C:
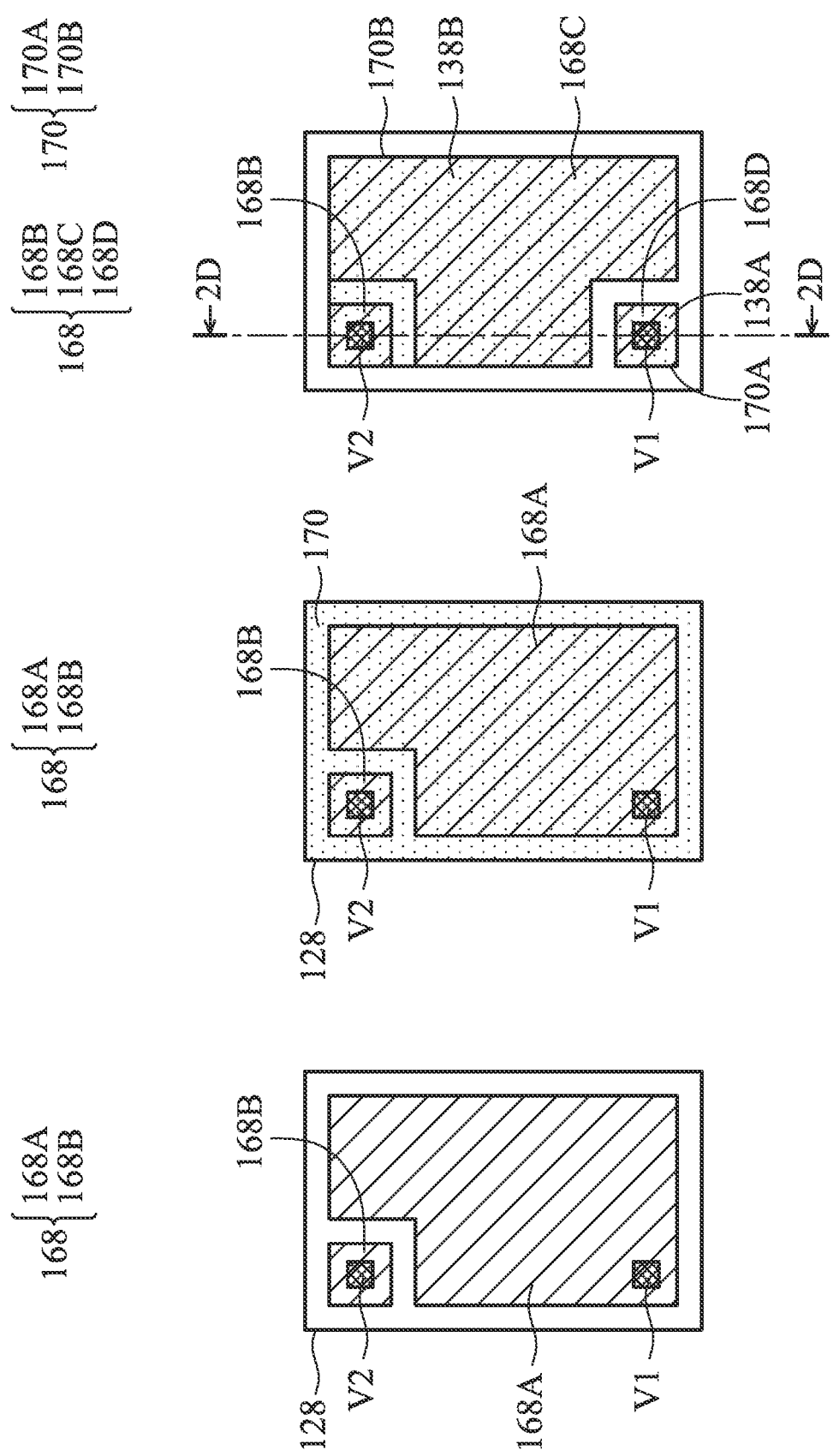
FIG. 2A is a top view illustrating one of the steps of the method for manufacturing a display device in accordance with some embodiments.
FIG. 2B is a top view illustrating one of the steps of the method for manufacturing a display device in accordance with some embodiments.
FIG. 2C is a top view illustrating one of the steps of the method for manufacturing a display device in accordance with some embodiments.

FIGS. 2A-2C are top views illustrating the method for manufacturing the electrode 138A and the electrode 138B of the third patterned conductive layer 138 in accordance with some embodiments.

Referring to FIG. 2A, in some embodiments, a first electrode layer 168 including an electrode block 168A and another electrode block 168B is formed on the transistor layer 128. In some embodiments, the electrode block 168A is electrically connected to a via V1 and used as an emitting electrode. The electrode block 168B is electrically connected to a via V2 and used as a common electrode. The electrode block 168A is electrically isolated to the electrode block 168B.

In some embodiments, the material of the first electrode layer 168 may include Cu, Al, Mo, W, Au, Cr, Ni, Pt, Ti, Ir, Rh, an alloy thereof, a combination thereof, or another metal material with good conductivity. In other embodiments, the materials of the first electrode layer 168 may be a non-metal material, as long as the material used has conductivity. The materials of the first electrode layer 168 may be formed by the aforementioned CVD, sputtering deposition, resistance heating evaporation, electron beam evaporation, or any other suitable deposition method.

Next, a test may be performed on the electrode block 168A that is used as an emitting electrode. Then, as shown in FIG. 2B, in the event that the device passes the test, a second electrode layer 170 may be formed on the transistor layer 128 and the first electrode layer 168 in accordance with some embodiments. The second electrode layer 170 covers the first electrode layer 168.

In some embodiments, the material of the second electrode layer 170 may include Cu, Al, Mo, W, Au, Cr, Ni, Pt, Ti, Ir, Rh, an alloy thereof, a combination thereof, or another metal material with good conductivity. In other embodiments, the materials of the second electrode layer 170 may be a non-metal material, as long as the material used has conductivity. The materials of the second electrode layer 170 may be formed by the aforementioned CVD, sputtering deposition, resistance heating evaporation, electron beam evaporation, or any other suitable deposition method.

Then, as shown in FIG. 2C, the electrode 138A and the electrode 138B of the third patterned conductive layer 138 are formed by patterning the first electrode layer 168 and the second electrode layer 170 in accordance with some embodiments.

In more detail, as shown in FIG. 2C, after the patterning process, the first electrode layer 168 is patterned to be an electrode block 168B, electrode block 168C and electrode block 168D, and the second electrode layer 170 is patterned to be an electrode block 170A and another electrode block 170B in accordance with some embodiments.

In some embodiments, the above-mentioned patterning process may be performed by a single etching step. However, in some other embodiments, the above-mentioned patterning process may be performed by two or more etching steps. Moreover, after one or more etching step is performed, photoresist ashing is applied to change the pattern of the photoresist, and then the above-mentioned patterning process may be performed again by one or more etching steps.

Figure 2D:
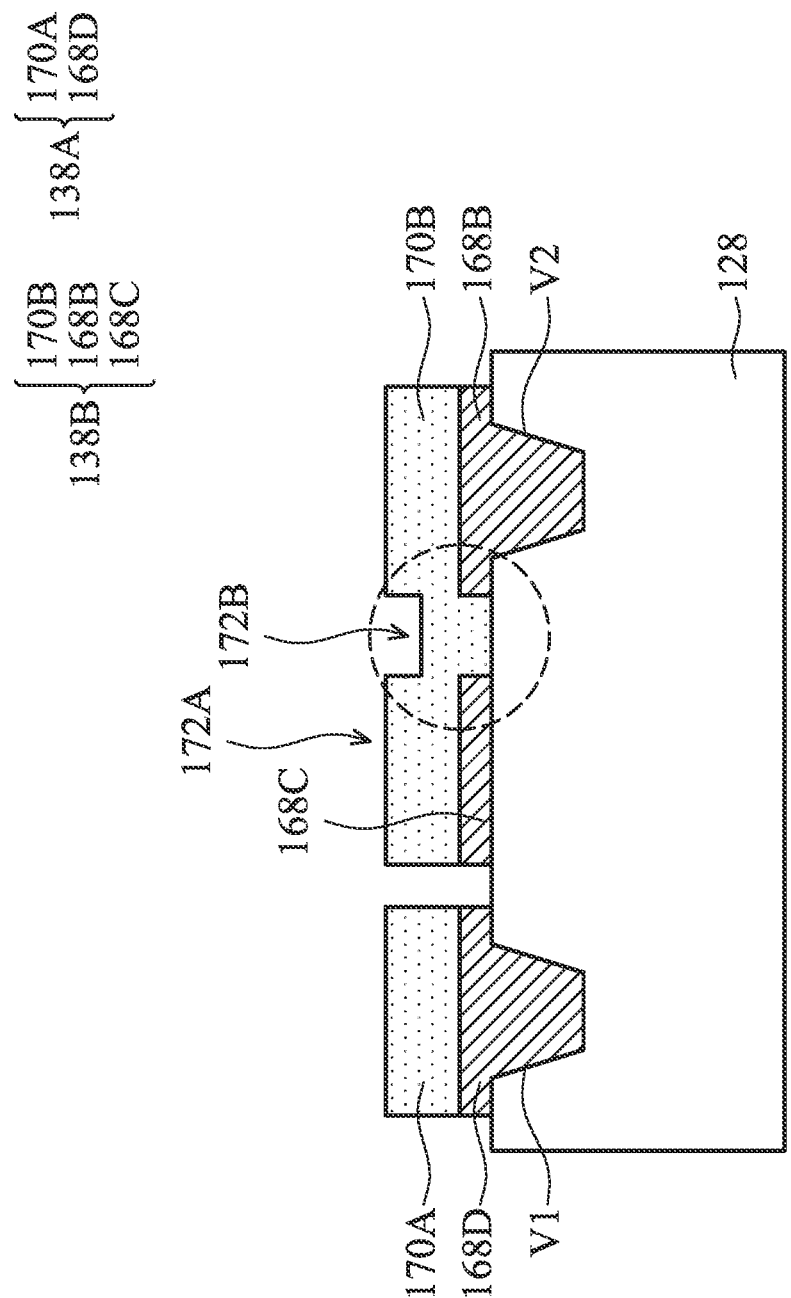
FIG. 2D is a cross-sectional view illustrating one of the steps of the method for manufacturing a display device in accordance with some embodiments.

FIG. 2D is a cross-sectional view illustrated along the section 2D-2D of FIG. 2C. In order to clarify the present disclosure, FIG. 2D does not illustrate the details of the structure and the recess of the transistor layer 128.

As shown in FIGS. 2C-2D, in some embodiments, the electrode block 170A of the second electrode layer 170 covers the electrode block 168D of the first electrode layer 168, and the electrode block 170A and the electrode block 168D form the electrode 138A in accordance with some embodiments. The electrode 138A is electrically connected to the via V1 and used as an emitting electrode.

In addition, the electrode block 170B of the second electrode layer 170 covers the electrode block 168B and the electrode block 168C of the first electrode layer 168, and the electrode block 170B, the electrode block 168B and the electrode block 168C form the electrode 138B. The electrode 138B is electrically connected to the via V2 and used as a common electrode.

In some embodiments, at least one of the electrode 138A and the electrode 138B has a first portion and a second portion, and the thickness of the first portion is greater than that of the second portion. For example, as shown in FIG. 2D, the electrode 138B has a first portion 172A and a second portion 172B, and the thickness of the first portion 172A is greater than that of the second portion 172B.

In more detail, the first portion 172A includes the first electrode layer 168 disposed on the top surface of the transistor layer 128, and the second transistor layer 170 disposed on the first electrode layer 168. The second portion 172B includes the second electrode layer 170 disposed on the top surface of the transistor layer 128.

In some embodiments, the materials of the first electrode layer 168 and the second electrode layer 170 may be the same. However, in other embodiments, the materials of the first electrode layer 168 and the second electrode layer 170 may be different.

Furthermore, in some embodiments, as shown in FIG. 2D, the electrode 138A is electrically isolated from the electrode 138B, and the second electrode layer 170 does not cover the side edges of the first electrode layer 168. However, in other embodiments, the second electrode layer 170 may also cover one or more side edge of the first electrode layer 168, as long as the electrode 138A is electrically isolated from the electrode 138B. In the embodiments, both of the electrode 138A and the electrode 138B have a first portion and a second portion with different thicknesses.

Some embodiments of the present disclosure may obtain accurate result of measurement by utilizing the electrode block 168A with greater area to measure the emission signals. In some embodiments, without stripping the first electrode layer 168, the formation of the electrode 138A and the electrode 138B by the aforementioned steps may obtain a common electrode 138B with greater area. Therefore, the damage of the stripping process may be avoided, and better common electrode signal may be obtained. Thus, the production yield of the devices may increase.

Figure 3:
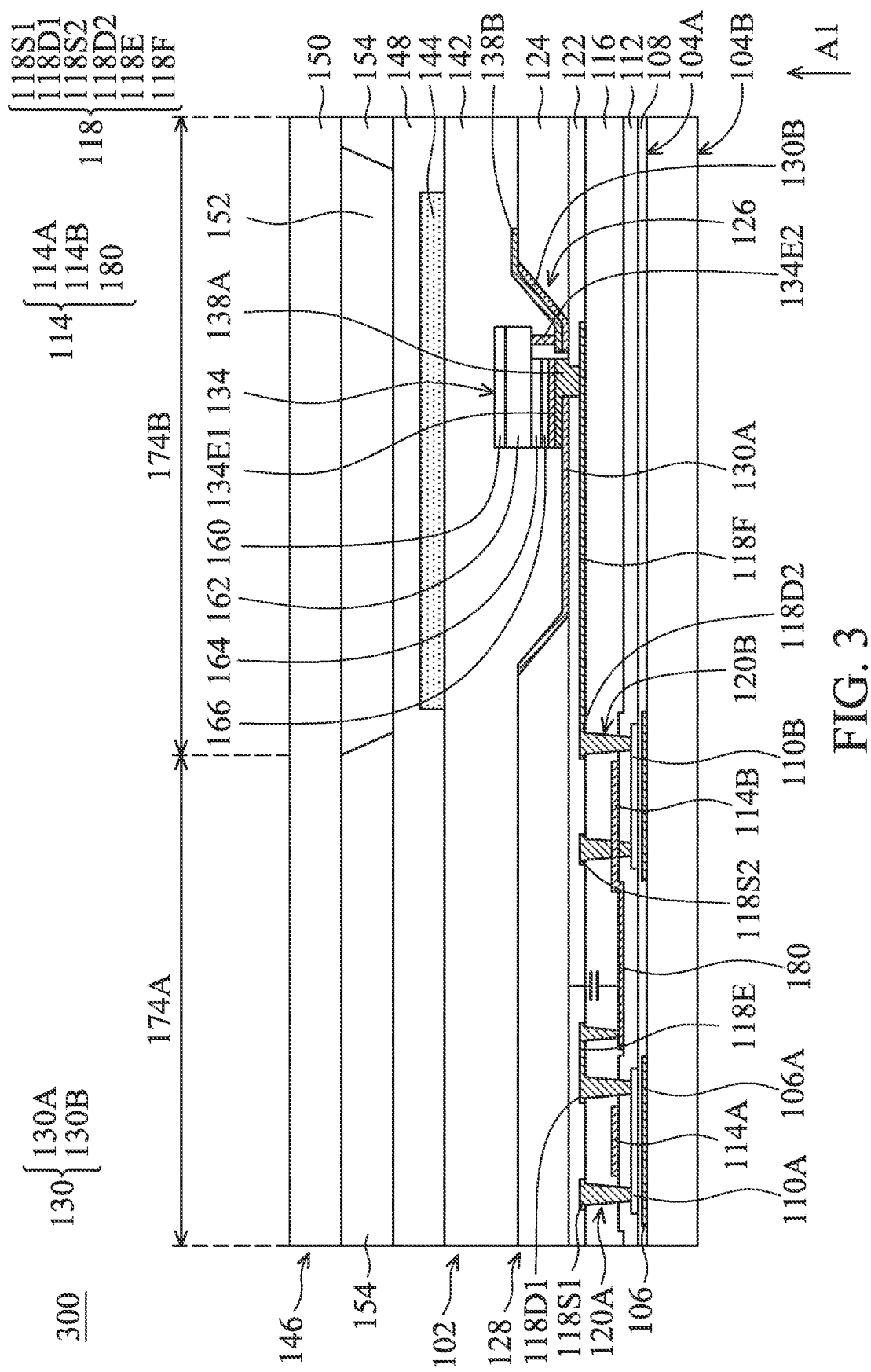
FIG. 3 is a cross-sectional view of a display device in accordance with some other embodiments.

FIG. 3 is a cross-sectional view of a display device 300 in accordance with some embodiments. As shown in FIG. 3, the display device 300 includes a light-shielding region 174A and a non-light-shielding region 174B adjacent to the light-shielding region 174A, and the color filter layer 152 is disposed in the non-light-shielding region 174B in accordance with some embodiments.

As shown in FIG. 3, the semiconductor layers 110A and 110B, the gate electrodes 114A and 114B, the source electrodes 118S1 and 118S2, and the drain electrodes 118D1 and 118D2 are disposed in the light-shielding region 174A, and the light-emitting element 134 is disposed in the non-light-shielding region 174B in accordance with some embodiments. That is to say, in some embodiments, the transistors 120A and 120B are disposed in the light-shielding region 174A, and the light-emitting element 134 is disposed in the non-light-shielding region 174B.

As shown in FIG. 3, the second patterned conductive layer 118 further includes an extension portion 118F, and the drain electrode 118D2 is electrically connected to the light-emitting element 134 through the extension portion 118F.

In some embodiments, through disposing transistors and light-emitting elements in different regions, the damage to transistors in the step of bonding light-emitting elements to the transistor layer may be avoided. Therefore, the production yield may increase.

As shown in FIG. 3, along a direction Al that is perpendicular to the top surface 104A of the substrate 104, the projection of the light-emitting element 134 on the substrate 104 is not overlapped with that of the transistor 120A and/or the transistor 120B on the substrate 104.

Figure 4A:
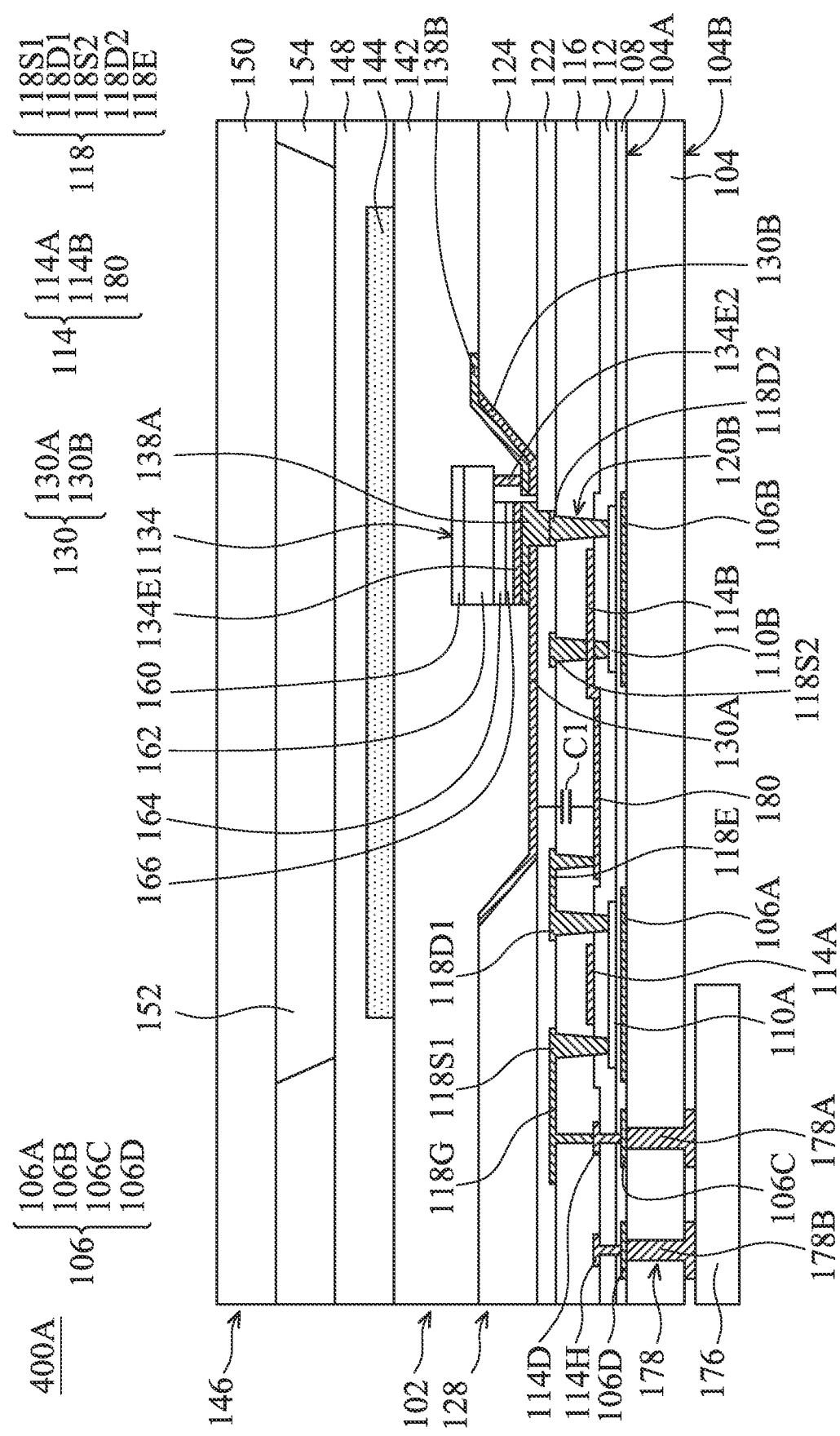
FIG. 4A is a cross-sectional view of a display device in accordance with some other embodiments.

FIG. 4A is a cross-sectional view of a display device 400A in accordance with some other embodiments. The display device 400A further includes a control circuit unit 176 disposed on the bottom surface 104B of the substrate 104, and a signal connection portion structure 178 passing through the substrate 104.

As shown in FIG. 4A, the signal connection portion structure 178 includes a first signal connection portion 178A electrically connected to the control circuit unit 176 and the source electrode 118S1. In addition, in some embodiments, the signal connection portion structure 178 further includes a second signal connection portion 178B electrically connected to the control circuit unit 176 and the gate electrode 114A and/or the gate electrode 114B.

In more detail, as shown in FIG. 4A, the patterned bottom conductive layer 106 further includes a third block 106C and a fourth block 106D in accordance with some embodiments. The first patterned conductive layer 114 further includes a conductive block 114D and another conductive block 114H, and the second patterned conductive layer 118 further includes an extension portion 118G. Through the first signal connection portion 178A, the third block 106C, the conductive block 114D and the extension portion 118G, the control circuit unit 176 is electrically connected to the source electrode 118S1. The control circuit unit 176 may send source signals to the source electrode 118S1 through the first signal connection portion 178A. In addition, in other embodiments, the control circuit unit 176 may also send source signals to the source electrode 118S2 through the first signal connection portion 178A.

Referring to FIG. 4A, in some embodiments, the conductive block 114H of the first patterned conductive layer 114 is electrically connected to the gate electrode 114A, and the control circuit unit 176 is electrically connected to the gate electrode 114A through the second signal connection portion 178B, the fourth block 106D and the conductive block 114H. Moreover, in other embodiments, the control circuit unit 176 may send gate signals to the gate electrode 114A through the second signal connection portion 178B.

Figure 4B:
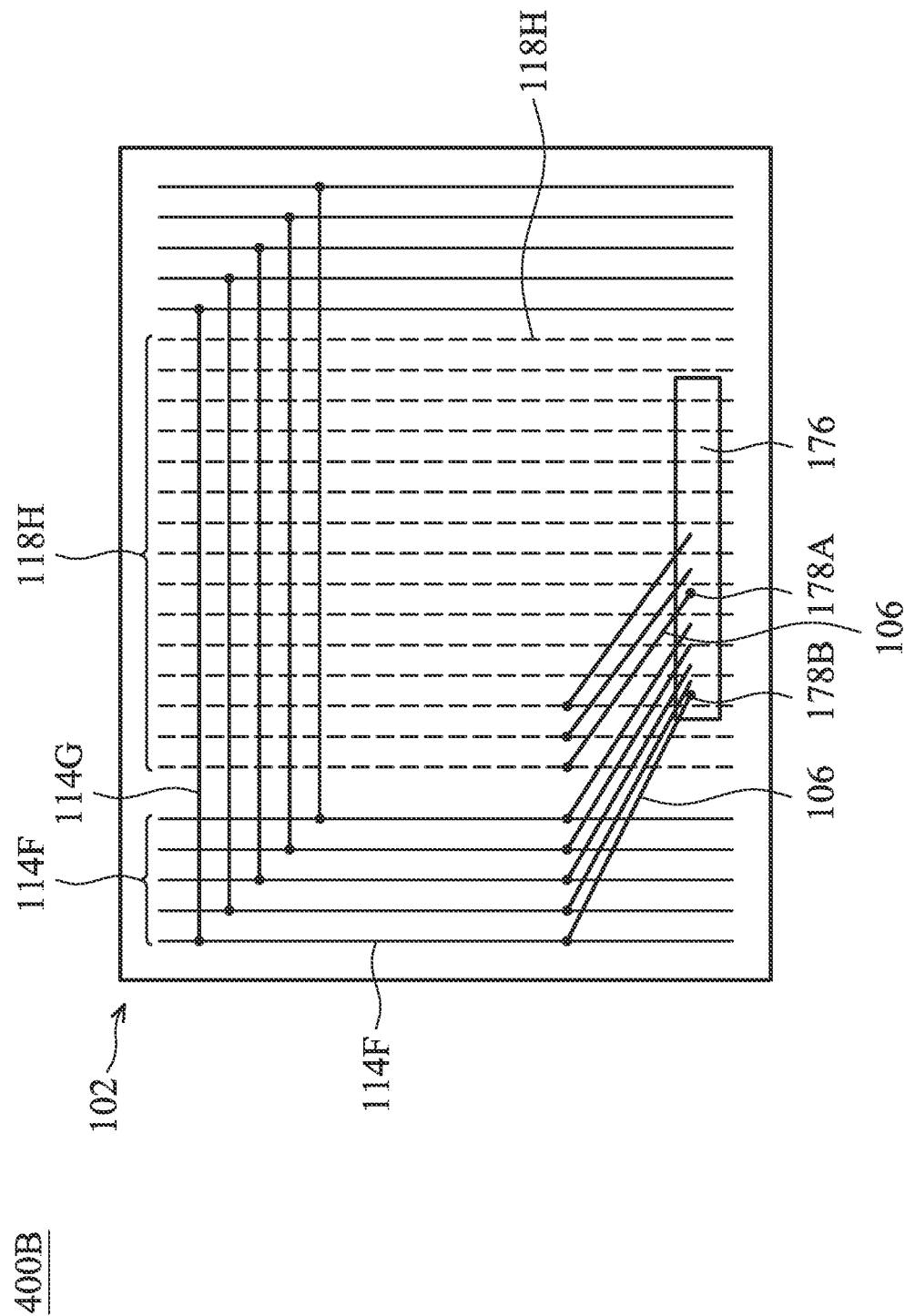
FIG. 4B is a top view of a display device in accordance with some other embodiments.

FIG. 4B is a top view of a display device 400B in accordance with other embodiments. As shown in FIG. 4B, the first patterned conductive layer includes multiple gate driving signal lines 114F and multiple gate lines 114G (or called scanning lines 114G). The gate lines 114G include the aforementioned gate electrode. The control circuit unit 176 is electrically connected to the gate electrode of the gate lines 114G through the second signal connection portion 178B, the patterned bottom conductive layer 106 and the gate driving signal lines 114F.

In addition, as shown in FIG. 4B, the second patterned conductive layer includes multiple scanning lines 118H, and the scanning lines 118H include the source electrode. The control circuit unit 176 is electrically connected to the source electrode of the scanning lines 118H through the first signal connection portion 178A and the patterned bottom conductive layer 106.

By utilizing the signal connection portion structure to electrically connect the control circuit unit, the source electrode and the gate electrode, some embodiments of the present disclosure may eliminate the required area that the control circuit unit is electrically connect to the source electrode and the gate electrode through other circuits. Therefore, the area of the device may be reduced further.

Figure 4C:
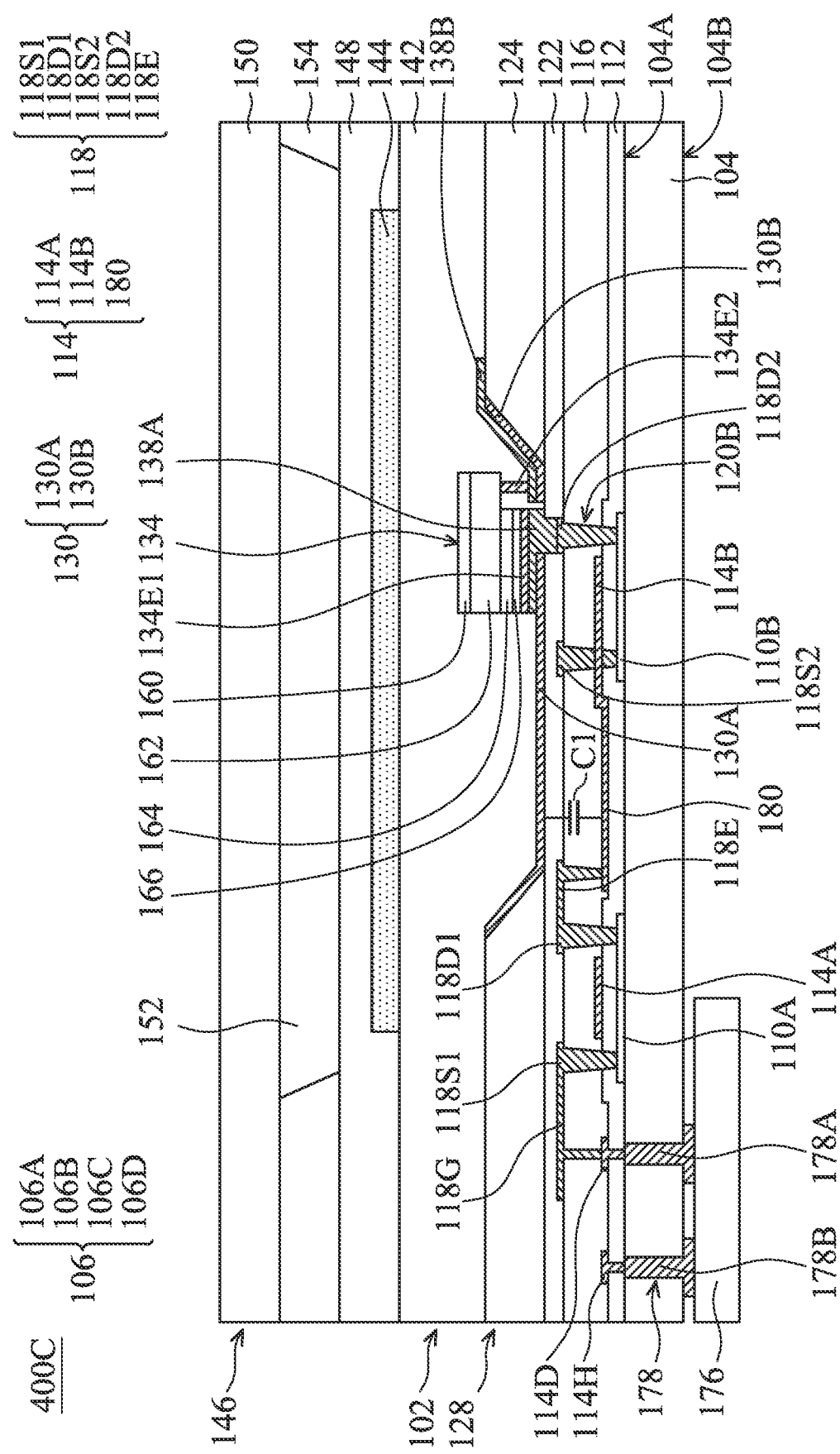
FIG. 4C is a cross-sectional view of a display device in accordance with some other embodiments.

FIG. 4C is a cross-sectional view of a display device 400C in accordance with other embodiments. As shown in FIG. 4C, the display device 400C does not include the patterned bottom conductive layer 106 and the buffer layer 108. In some embodiments, the control circuit unit 176 is electrically connected to the source electrode 118S1 and/or 118S2 through the first signal connection portion 178A, the conductive block 114D and the extension portion 118G. In some embodiments, the control circuit unit 176 is electrically connected to the gate electrode 114A through the second signal connection portion 178B and the conductive block 114H.

Figure 5A:
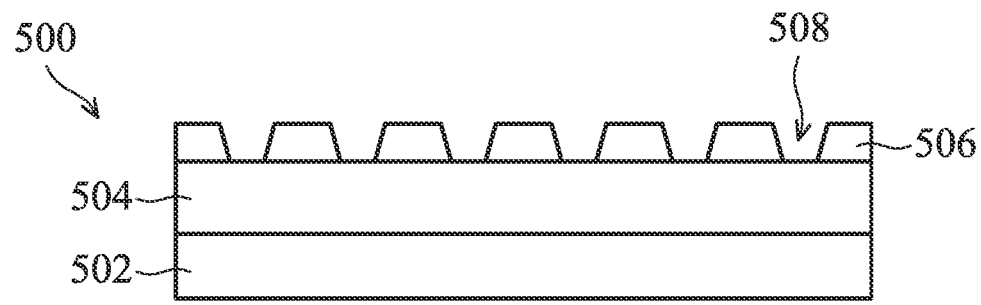
FIG. 5A is a cross-sectional view illustrating an imprinting die in one of the steps of the method for manufacturing a display device in accordance with some embodiments.

In some embodiments, the aforementioned ACF may be formed by the steps of the process shown in FIGS. 5A-5G. FIG. 5A is a cross-sectional view illustrating an imprinting die 500 in one of the steps of the method for manufacturing display devices in accordance with some embodiments. The imprinting die 500 includes a substrate 502 and a dielectric layer 504 disposed on the substrate 502. In some embodiments, the dielectric layer 504 may be polymer materials, ceramic materials, other composite materials, or any other suitable material, for example, polydimethylsiloxane (PDMS), cyclic olefin polymers, or quartz glass.

Referring to FIG. 5A, in some embodiments, a patterned photoresist layer 506 may be formed on the dielectric layer 504, and the patterned photoresist layer 506 has multiple openings 508 exposing the dielectric layer 504.

Figure 5B:
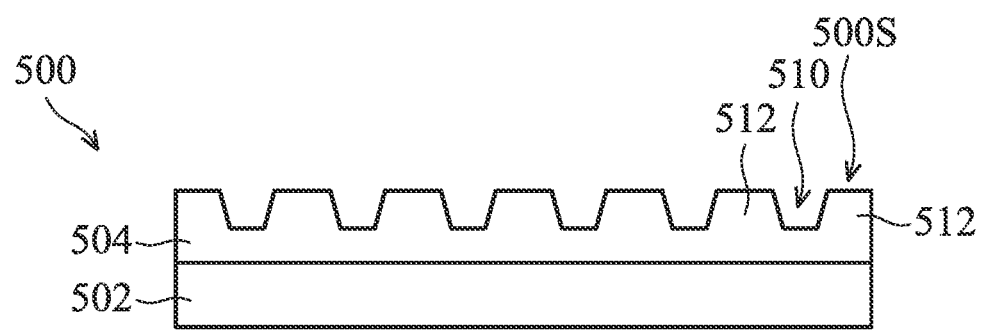
FIG. 5B is a cross-sectional view illustrating an imprinting die in one of the steps of the method for manufacturing a display device in accordance with some embodiments.

Then, referring to FIG. 5B, FIG. 5B is a cross-sectional view illustrating the imprinting die 500 in one of the steps of the method for manufacturing display devices in accordance with some embodiments. The patterned photoresist layer 506 is used as a mask to etch the dielectric layer 504, in order to form multiple notches 510 on the dielectric layer 504. In some embodiments, the notches 510 do not expose the substrate 502. In some embodiments, as shown in FIG. 5B, multiple protrusions 512 are formed between multiple notches 510. That is to say, the major surface 500S of the imprinting die 500 has multiple protrusions 512 and forms imprinting patterns.

Figure 5C:
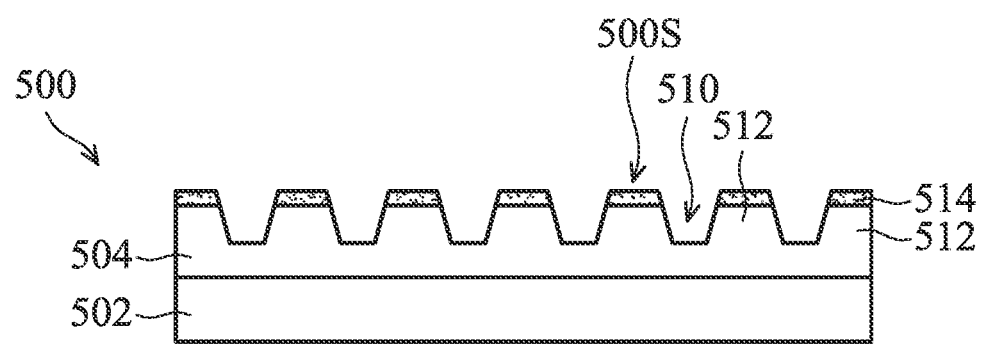
FIG. 5C is a cross-sectional view illustrating an imprinting die in one of the steps of the method for manufacturing a display device in accordance with some embodiments.

Referring to FIG. 5C, FIG. 5C is a cross-sectional view illustrating the imprinting die 500 in one of the steps of the method for manufacturing display devices in accordance with some embodiments. As shown in FIG. 5C, a surface treatment process is performed on the top surface of multiple protrusions 512 of the imprinting die 500 in order to form a surface treatment layer 514 on the upper portions of the protrusions 512 in accordance with some embodiments. In some embodiments, the surface treatment process may include plasma bombardment process, chemical modification process, UV-Ozone treatment process, or any other suitable process. In some embodiments, the surface treatment layer 514 is a portion of the protrusions 512, and the top surface of the surface treatment layer 514 is equivalent to that of the protrusions 512.

Figure 5D:
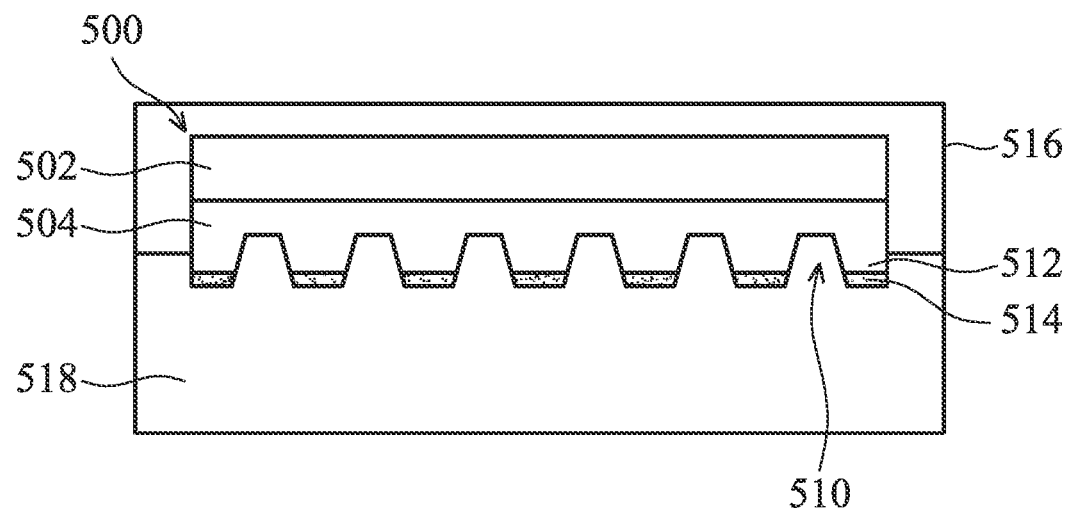
FIG. 5D is a cross-sectional view illustrating an imprinting die in one of the steps of the method for manufacturing a display device in accordance with some embodiments.
Figure 5E:
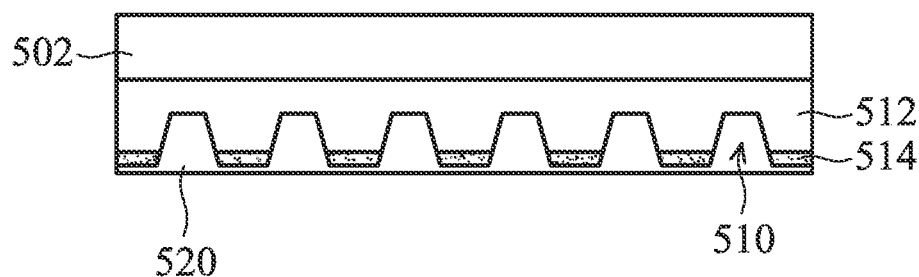
FIG. 5E is a cross-sectional view illustrating an imprinting die in one of the steps of the method for manufacturing a display device in accordance with some other embodiments.

Then, referring to FIG. 5D, FIG. 5D is a cross-sectional view illustrating the imprinting die 500 in one of the steps of the method for manufacturing display devices in accordance with some embodiments. As shown in FIG. 5D, a chamber 516 is provided in accordance with some embodiments. An anisotropic conductive solution 518 is placed in the chamber 516. After that, the major surface 500S of the protrusions 512 of the imprinting die 500 is immersed into the anisotropic conductive solution 518 in order to form an anisotropic conductive coating 520 on the major surface 500S of the protrusions 512 of the imprinting die 500. As shown in FIG. 5E, the anisotropic conductive coating 520 covers the top surface of the surface treatment layer 514 of the multiple protrusions 512, and fills into the multiple notches 510 between the protrusions 512.

Figure 5F:
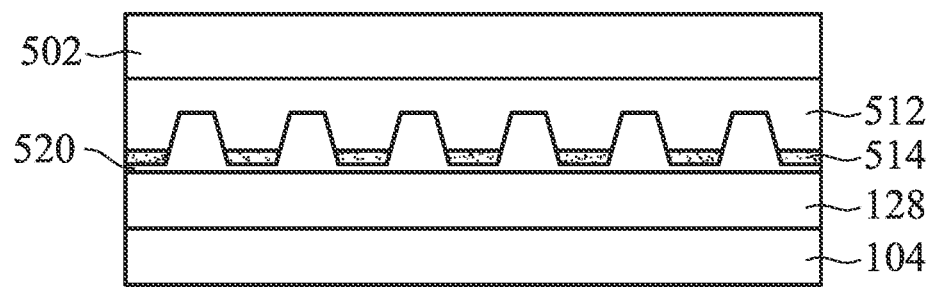
FIG. 5F is a cross-sectional view illustrating an imprinting die and a substrate in one of the steps of the method for manufacturing a display device in accordance with some other embodiments.

Next, referring to FIG. 5F, FIG. 5F is a cross-sectional view illustrating the imprinting die 500 and the substrate 104 in one of the steps of the method for manufacturing display devices in accordance with some embodiments. As shown in FIG. 5F, an imprinting process is performed on the transistor layer 128 of the substrate 104 by the imprinting die 500 in order to imprint the anisotropic conductive coating 520 on the protrusions 512 on the transistor layer 128, and form the patterned ACF 132 over the transistor layer 128, as shown in FIG. 5G.

In some embodiments, the imprinting strength of the imprinting process is in a range from about 10N to about 1500N, such as from about 100N to about 1000N, or from about 500N to about 800N. In the event that the imprinting strength is too small, for example, less than 10N, the anisotropic conductive coating 520 may not be effectively imprinted to the transistor layer 128. However, if the imprinting strength is too big, for example, greater than 1500N, the device may be damaged.

Figure 5G:
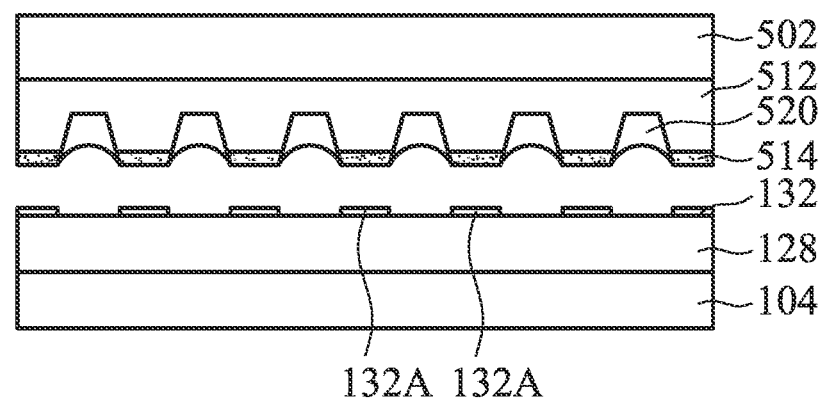
FIG. 5G is a cross-sectional view illustrating an imprinting die and a substrate in one of the steps of the method for manufacturing a display device in accordance with some other embodiments.

In addition, as shown in FIG. 5G, the anisotropic conductive coating 520 that fills into the notches 510 between the multiple protrusions 512 are not imprinted to the transistor layer 128. Therefore, in some embodiments, the aforementioned imprinting process imprints the anisotropic conductive coating 520 on the protrusions 512 to the transistor layer 128, and may form the patterned ACF 132 on the transistor layer 128. As shown in FIG. 5G, the patterned ACF 132 includes multiple anisotropic conductive blocks 132A in accordance with some embodiments. In some embodiments, each of the anisotropic conductive blocks 132A is disposed corresponding to one sub-pixel region.

In some embodiments, the production cost may reduce by forming the patterned ACF 132 in comparison with forming full layer of ACF.

Figure 6A:
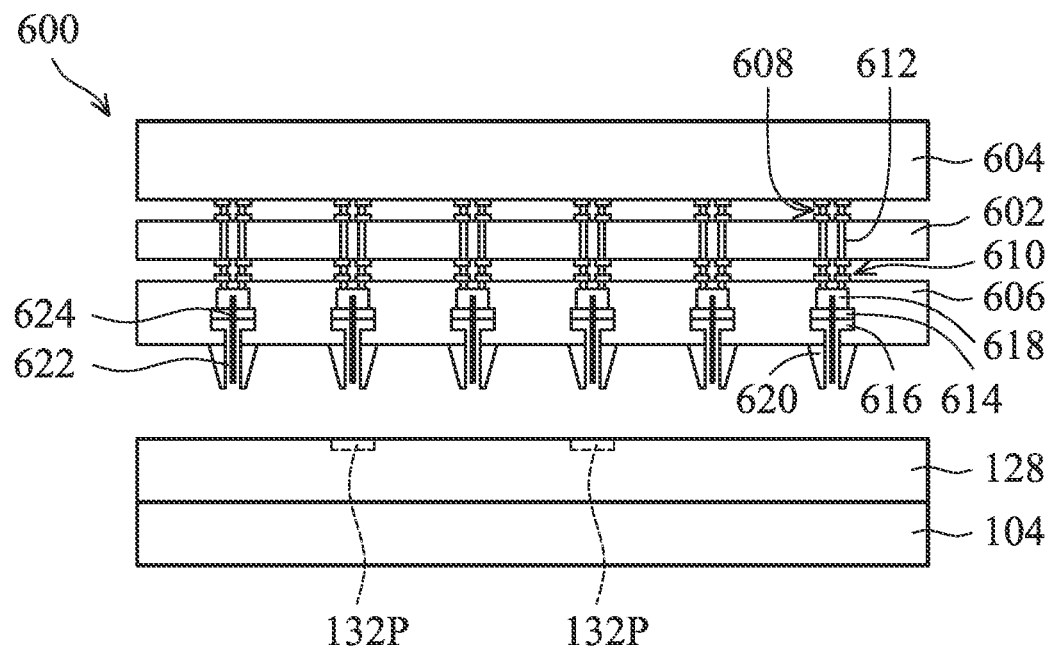
FIG. 6A is a cross-sectional view illustrating the spray coating equipment and a substrate in one of the steps of the method for manufacturing a display device in accordance with some other embodiments.

FIG. 6A is a cross-sectional view illustrating the spray coating equipment 600 and the substrate 104 with the transistor layer 128 in one of the steps of the method for manufacturing display devices in accordance with other embodiments. As shown in FIG. 6A, there is one or more patterned ACF predetermined coating region 132P on the transistor layer 128, corresponding to the patterns predetermined forming the patterned ACF 132.

Next, spray coating equipment 600 is provided. The spray coating equipment 600 includes a substrate 602, a control circuit board 604 and a spray coating portion 606. As shown in FIG. 6A, the substrate 602 and the control circuit board 604 are connected through a conductive connection portion 608, and the substrate 602 and the spray coating portion 606 are connected through another conductive connection portion 610. A conductive layer 612 is disposed inside of the substrate 602, and electrically connected to the corresponding conductive connection portions 608 and 610.

Referring to FIG. 6A, in some embodiments, the spray coating portion 606 includes multiple chambers 614 where an anisotropic conductive solution 616 is placed. A motor 618 is disposed on each of the chambers 614. In some embodiments, the motors 618 are step motors, for example. Referring to FIG. 6A, the spray coating portion 606 of the spray coating equipment 600 has multiple spray nozzles 620. Each of the spray nozzles 620 corresponds to one chamber 614, and has an opening 622. Referring to FIG. 6A, each of the motors 618 is connected to a cylinder 624 that passes through the chamber 614 and the anisotropic conductive solution 616 and enters the opening 622.

Referring to FIG. 6A, the multiple spray nozzles 620 are towards the transistor layer 128. In some embodiments, the one or more spray nozzle 620 is aligned with the one or more patterned ACF predetermined coating region 132P.

Figure 6B:
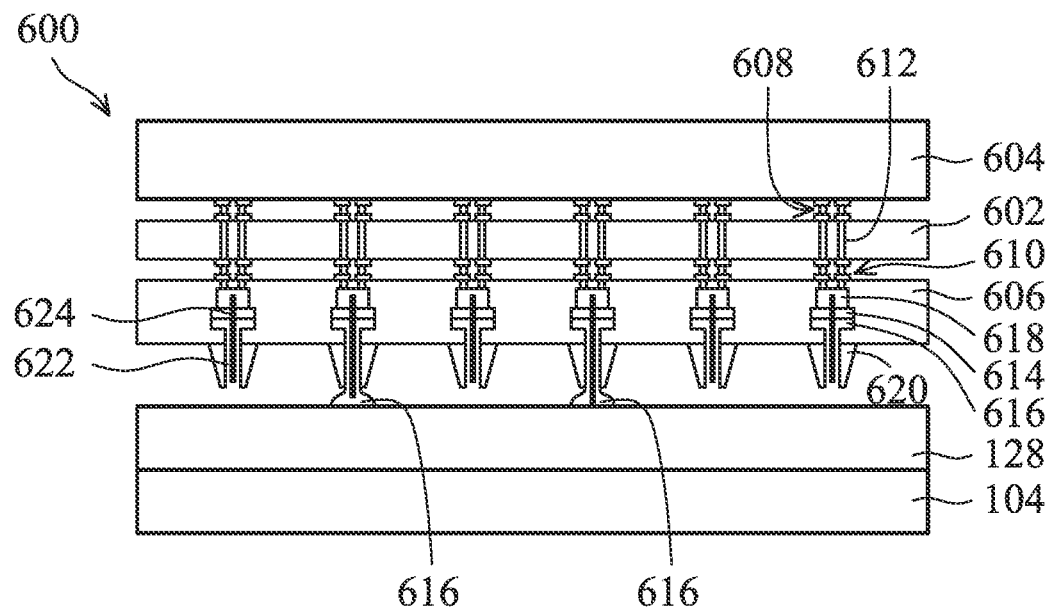
FIG. 6B is a cross-sectional view illustrating the spray coating equipment and a substrate in one of the steps of the method for manufacturing a display device in accordance with some other embodiments.
Figure 6C:
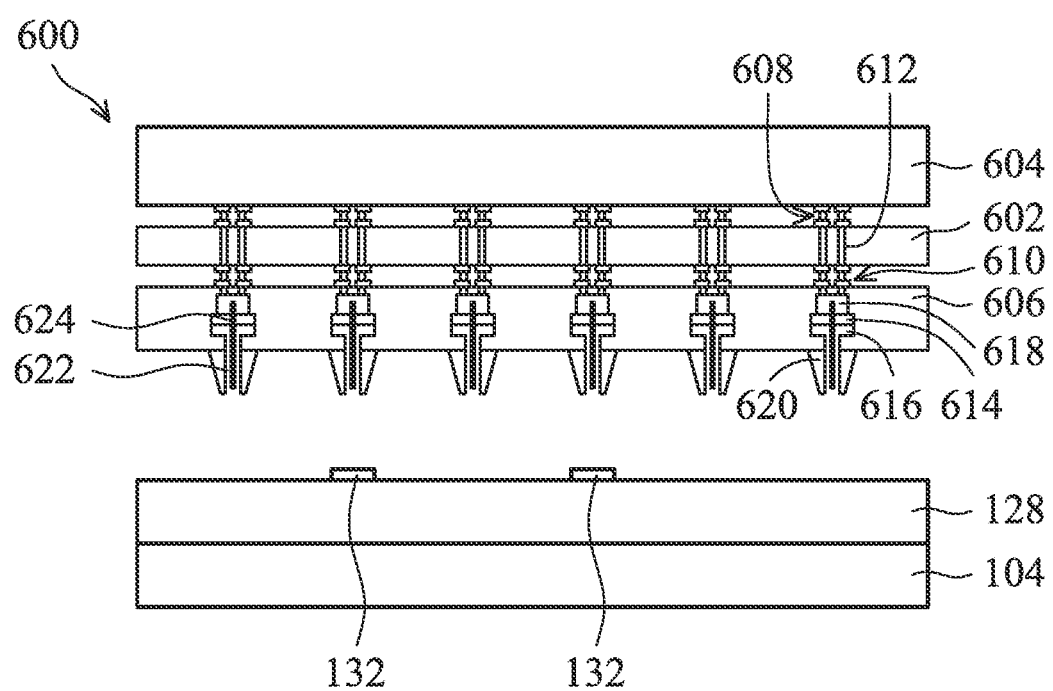
FIG. 6C is a cross-sectional view illustrating the spray coating equipment and a substrate in one of the steps of the method for manufacturing a display device in accordance with some other embodiments.

Next, referring to FIGS. 6B-6C, in order to form the patterned ACF 132, the one or more patterned ACF predetermined coating region 132P is coated with the anisotropic conductive solution 616 by the one or more spray nozzle 620, which is aligned with the one or more patterned ACF predetermined coating region 132P.

In more detail, referring to FIG. 6B, the cylinders 624 are extended downwards approaching the transistor layer 128 by the motors 618. The cylinders 624 may either not contact with the transistor layer 128 or directly contact with the transistor layer 128. Then, the anisotropic conductive solution 616 flows downwards along the cylinders 624 and coats on the patterned ACF predetermined coating region 132P.

Next, referring to FIG. 6C, the cylinders 624 retract upwards, and the patterned ACF 132 is formed on the transistor layer 128. In some embodiments, forming the patterned ACF 132 may reduce the process cost in comparison with forming a full layer ACF.

In some embodiments, the light-emitting elements of the present disclosure may be placed over the transistor layer by the methods as follows.

Figure 7A:
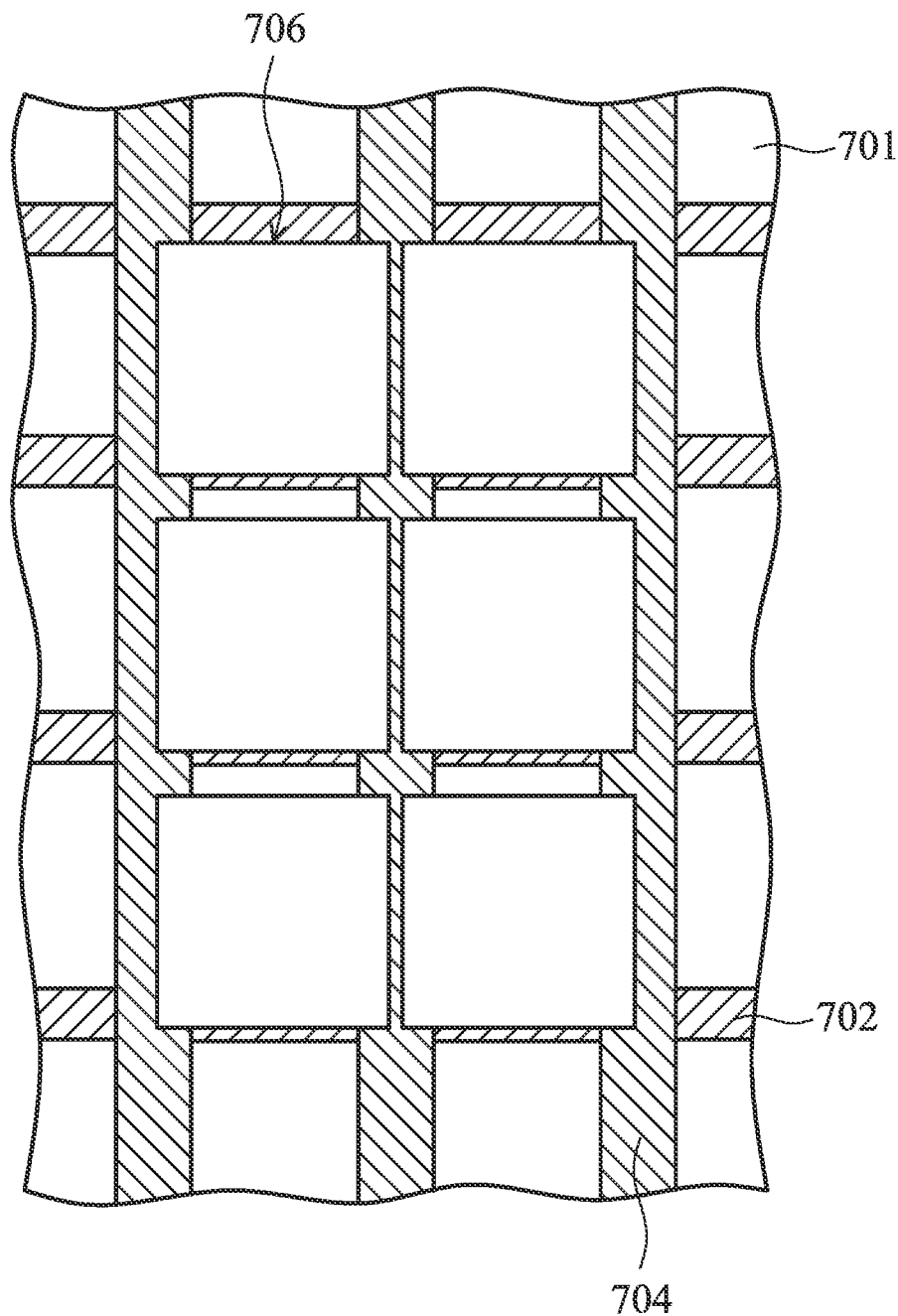
FIG. 7A is a top view of a pickup device in accordance with some embodiments.

First, a pickup device is provided. FIG. 7A is a top view of a pickup device 700A in accordance with some embodiments. As shown in FIG. 7A, the pickup device 700A includes multiple gate lines 702 and data lines 704 disposed on a substrate 701, and pickup units 706 disposed on the substrate 701 and between two gate lines 702 and two data lines 704 in accordance with some embodiments.

In some embodiments, the pickup device 700A inputs signals at the gate lines 702 in turn, and it controls each of the pickup units 706 as to whether to pick up a light-emitting element by controlling the signals of the data lines 704.

Figure 7B:
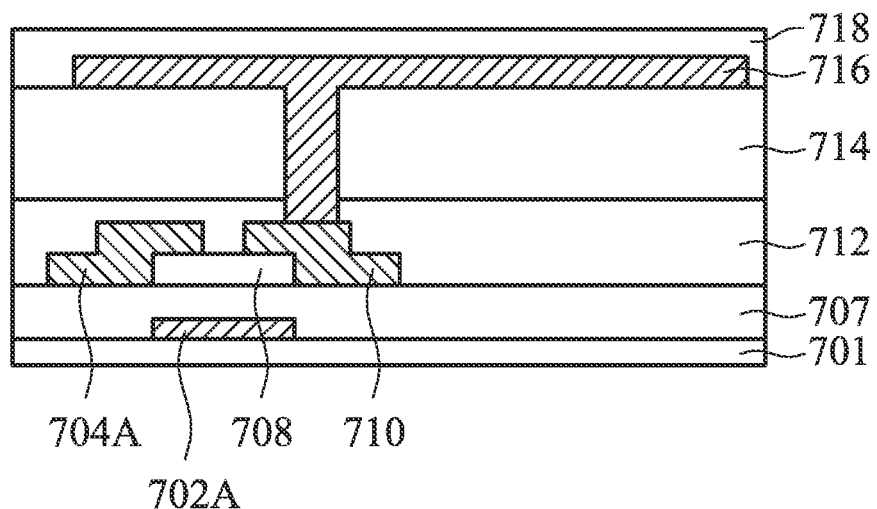
FIG. 7B is a cross-sectional view of a pickup device in accordance with some embodiments.

FIG. 7B is a cross-sectional view of a pickup unit 706B in accordance with some embodiments. As shown in FIG. 7B, the pickup unit 706B includes a gate electrode 702A disposed on the substrate 701, and a gate dielectric layer 707 disposed on the gate electrode 702A.

The gate electrode 702A may be amorphous silicon, polysilicon, one or more metal, metal nitride, conductive metal oxide, or a combination thereof. The metal may include but not be limited to molybdenum, tungsten, titanium, tantalum, platinum, or hafnium. The metal nitride may include but not be limited to molybdenum nitride, tungsten nitride, titanium nitride, and tantalum nitride. The conductive metal oxide may include but not be limited to ruthenium oxide and indium tin oxide. The gate electrode 702A may be formed by the aforementioned CVD, sputtering deposition, resistance heating evaporation, electron beam evaporation, or any other suitable deposition method. For example, in an embodiment, an amorphous silicon conductive material layer or a polysilicon conductive material layer may be obtained by LPCVD depositing in a temperature between 525° C.-650° C. The thickness may be in a range from about 1000 Å to about 10000 Å.

The gate dielectric layer 707 may be silicon oxide, silicon nitride, silicon oxynitride, high-k dielectric materials, any other suitable dielectric material, or a combination thereof. The high-k dielectric materials may be metal oxides, metal nitrides, metal silicides, transition metal oxides, transition metal nitrides, transition metal silicides, metal oxynitrides, metal aluminates, zirconium silicate, zirconium aluminate.

For example, the high-k dielectric materials may be LaO, AlO, ZrO, TiO, $Ta_2O_5$, $Y_2O_3$, $SrTiO_3$ (STO), $BaTiO_3$ (BTO), BaZrO, $HfO_2$, $HfO_3$, HfZrO, HfLaO, HfSiO, HfSiON, LaSiO, AlSiO, HfTaO, HfSiO, HfTaTiO, HfAlON, (Ba,Sr) $TiO_3$ (BST), $Al_2O_3$, another suitable high-k dielectric materials, or a combination thereof. The gate dielectric layer 707 may be formed by CVD or spin-on coating. The CVD may be, for example, LPCVD, LTCVD, RTCVD, PECVD, ALD, or another commonly used method.

As shown in FIG. 7B, the pickup unit 706B further includes a semiconductor layer 708 disposed on the gate dielectric layer 707. The semiconductor layer 708 is disposed corresponding to the gate electrode 702A. A source electrode 704A and a drain electrode 710 are respectively disposed on the opposite sides of the semiconductor layer 708, and partially overlapped with the portions of the semiconductor layer 708 at the opposite sides.

The semiconductor layer 708 may include elemental semiconductors including silicon and germanium, compound semiconductors including gallium nitride (GaN), silicon carbide, gallium arsenide, gallium phosphide, indium phosphide, indium arsenide and/or indium antimonide, alloy semiconductors including SiGe, GaAsP, AlInAs, AlGaAs, GaInAs, GaInP and/or GaInAsP, or a combination thereof.

The materials of the source electrode 704A and the drain electrode 710 may include Cu, Al, Mo, W, Au, Cr, Ni, Pt, Ti, Ir, Rh, an alloy thereof, a combination thereof, or another metal material with good conductivity. In other embodiments, the material of the source electrode 704A and the drain electrode 710 may be a non-metal material, as long as the material used has conductivity. The material of the source electrode 704A and the drain electrode 710 may be formed by the aforementioned CVD, sputtering deposition, resistance heating evaporation, electron beam evaporation, or any other suitable deposition method. In some embodiments, the material of the source electrode 704A and the drain electrode 710 may be the same and formed by the same deposition process. However, in other embodiments, the source electrode 704A and the drain electrode 710 may be formed by different deposition processes, and the materials used may be different from each other.

As shown in FIG. 7B, the pickup unit 706B further includes an insulating layer 712 covering the semiconductor layer 708, the source electrode 704A and the drain electrode 710. The insulating layer 712 may be silicon nitride, silicon dioxide, or silicon oxynitride. The insulating layer 712 may be formed by CVD or spin-on coating. The CVD may be, for example, LPCVD, LTCVD, RTCVD, PECVD, ALD, or another commonly used method.

Next, an insulating layer 714 may be selectively disposed on the insulating layer 712. The material of the insulating layer 714 may be organic insulating materials (photosensitive resin) or inorganic insulating materials (silicon nitride, silicon oxide, silicon oxynitride, silicon carbide, aluminum oxide, or a combination thereof). As shown in FIG. 7B, the insulating layer 714 is deposited on the insulating layer 712 in a carpet covering manner in accordance with some embodiments.

Referring to FIG. 7B, in some embodiments, the pickup unit 706B further includes an electrode 716 disposed on the insulating layers 712 and 714, and the electrode 716 is electrically connected to the drain electrode 710.

In some embodiments, the material of the electrode 716 may include Cu, Al, Mo, W, Au, Cr, Ni, Pt, Ti, Ir, Rh, an alloy thereof, a combination thereof, or another metal material with good conductivity. In other embodiments, the material of the electrode 716 may be a non-metal material, as long as the material used has conductivity. In some embodiments, the material of the electrode 716 may be formed by the aforementioned CVD, sputtering deposition, resistance heating evaporation, electron beam evaporation, or any other suitable deposition method.

Referring to FIG. 7B, in some embodiments, the pickup unit 706B further includes an insulating layer 718 disposed on the electrode 716.

The insulating layer 718 may be silicon oxide, silicon nitride, silicon oxynitride, high-k dielectric materials, any other suitable dielectric material, or a combination thereof. The high-k dielectric materials may be metal oxides, metal nitrides, metal silicides, transition metal oxides, transition metal nitrides, transition metal silicides, metal oxynitrides, metal aluminates, zirconium silicate, zirconium aluminate. For example, the high-k dielectric materials may be LaO, AlO, ZrO, TiO, $Ta_2O_5$, $Y_2O_3$, $SrTiO_3$ (STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr) $TiO_3$ (BST), $Al_2O_3$, another suitable high-k dielectric material, or a combination thereof. The insulating layer 718 may be formed by CVD or spin-on coating.

Figure 7C:
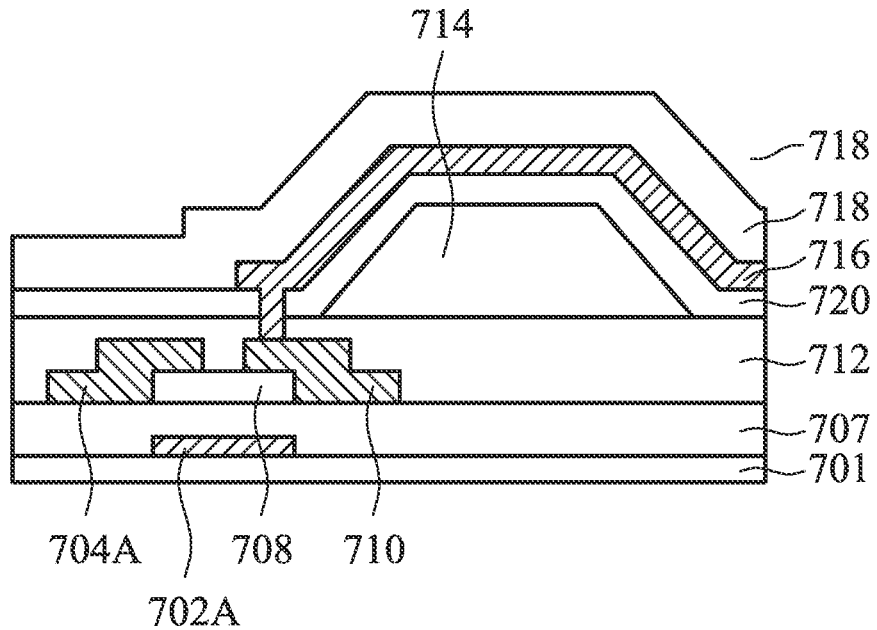
FIG. 7C is a cross-sectional view of a pickup device in accordance with some other embodiments.

FIG. 7C is a cross-sectional view of a pickup unit 706C in accordance with other embodiments. As shown in FIG. 7C, the insulating layer 714 is a bump in accordance with some embodiments. In some embodiments, the pickup unit 706B further includes an insulating layer 720 disposed on the insulating layer 714. In some embodiments, the insulating layer 720 may be silicon nitride, silicon dioxide, silicon oxynitride, or any other suitable insulating material. In some embodiments, the insulating layer 720 may be formed by the aforementioned CVD, spin-on coating, or any other suitable method. As shown in FIG. 7C, the insulating layers 716 and 718 are conformally disposed on the insulating layers 714 and 720 in accordance with some embodiments.

Figure 7D:
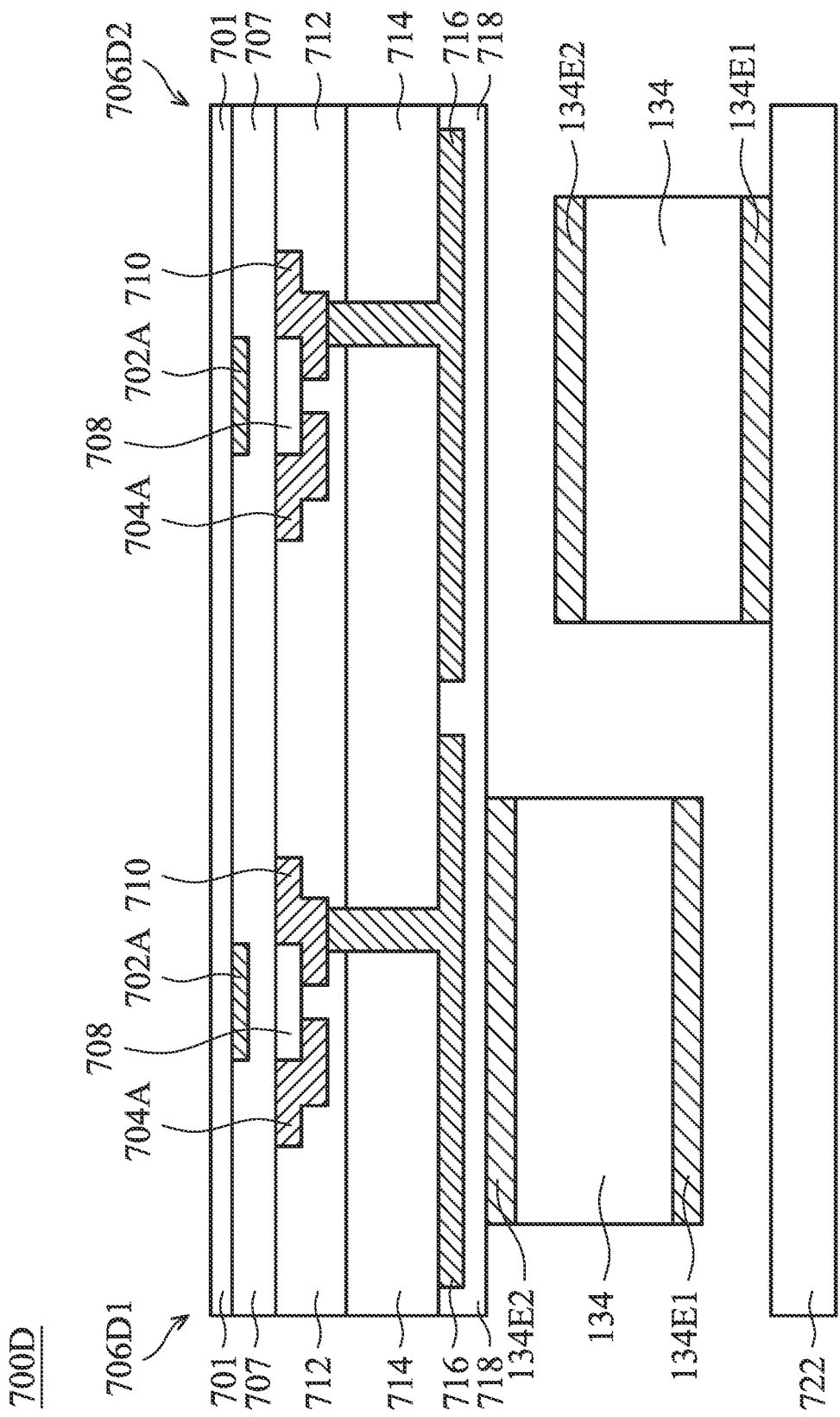
FIG. 7D is a cross-sectional view of a pickup device and a light-emitting element in accordance with some embodiments.

FIG. 7D is a cross-sectional view of a pickup device 700D and the light-emitting element 134 in accordance with other embodiments. The pickup device 700D includes two pickup units 706D1 and 706D2. The pickup units 706D1 and 706D2 may be controlled regarding whether to pick up the light-emitting element 134 by controlling the signals of gate lines and data lines. For example, as shown in FIG. 7D, the pickup unit 706D1 picks up the light-emitting element 134 on a carrier substrate 722, and the pickup unit 706D2 does not pick up the light-emitting element 134 in accordance with other embodiments.

Figure 7E:
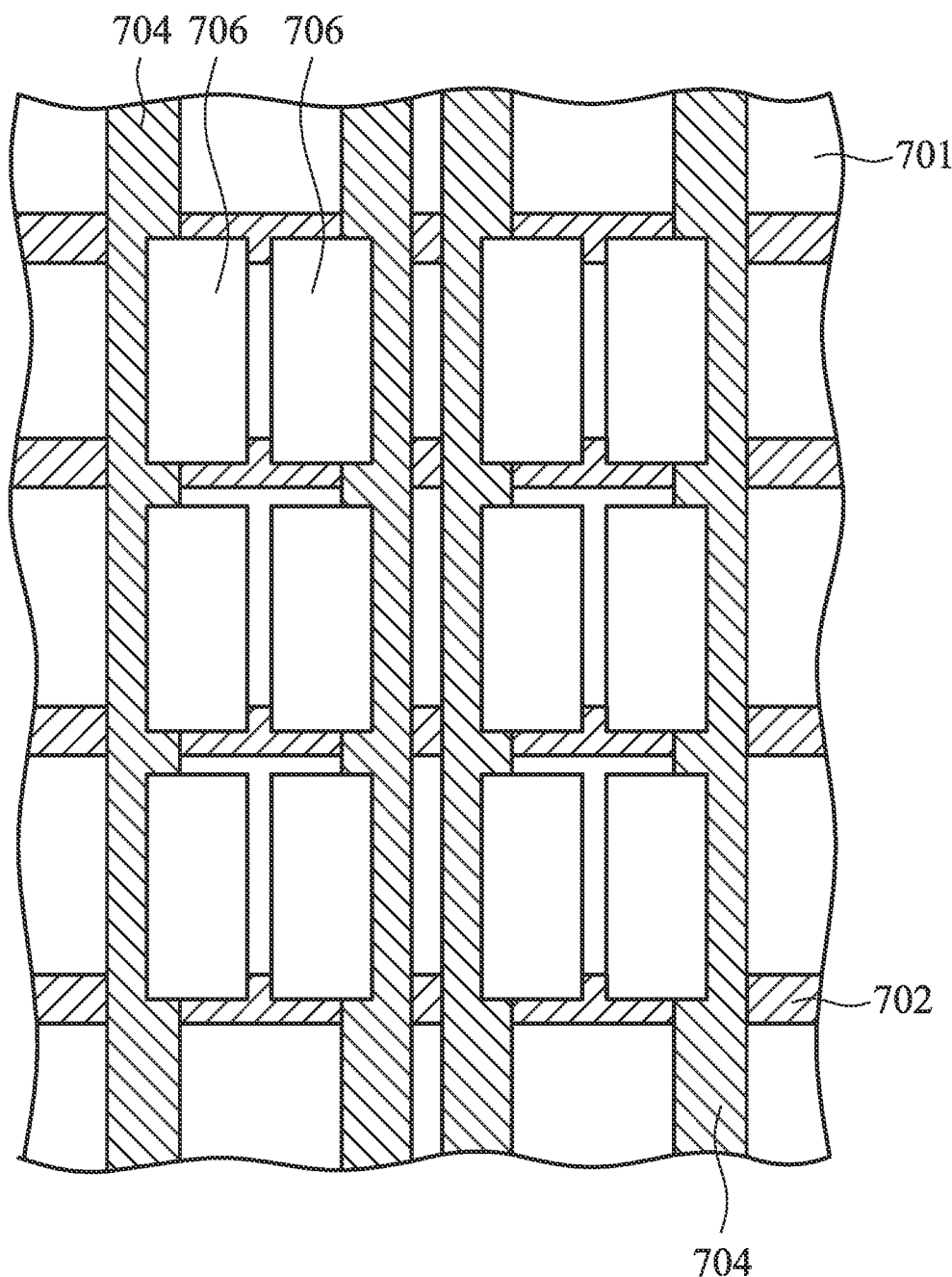
FIG. 7E is a top view of a pickup device in accordance with some other embodiments.

FIG. 7E is a top view of a pickup device 700E in accordance with other embodiments. As shown in FIG. 7E, two pickup units 706 are disposed between two gate lines 702 and two data lines 704 in accordance with other embodiments. The pickup device 700F inputs signals at the gate lines 702 in turn, and it controls each of the pickup units 706 regarding whether to pick up a light-emitting element by controlling the signals of the data lines 704.

Figure 7F:
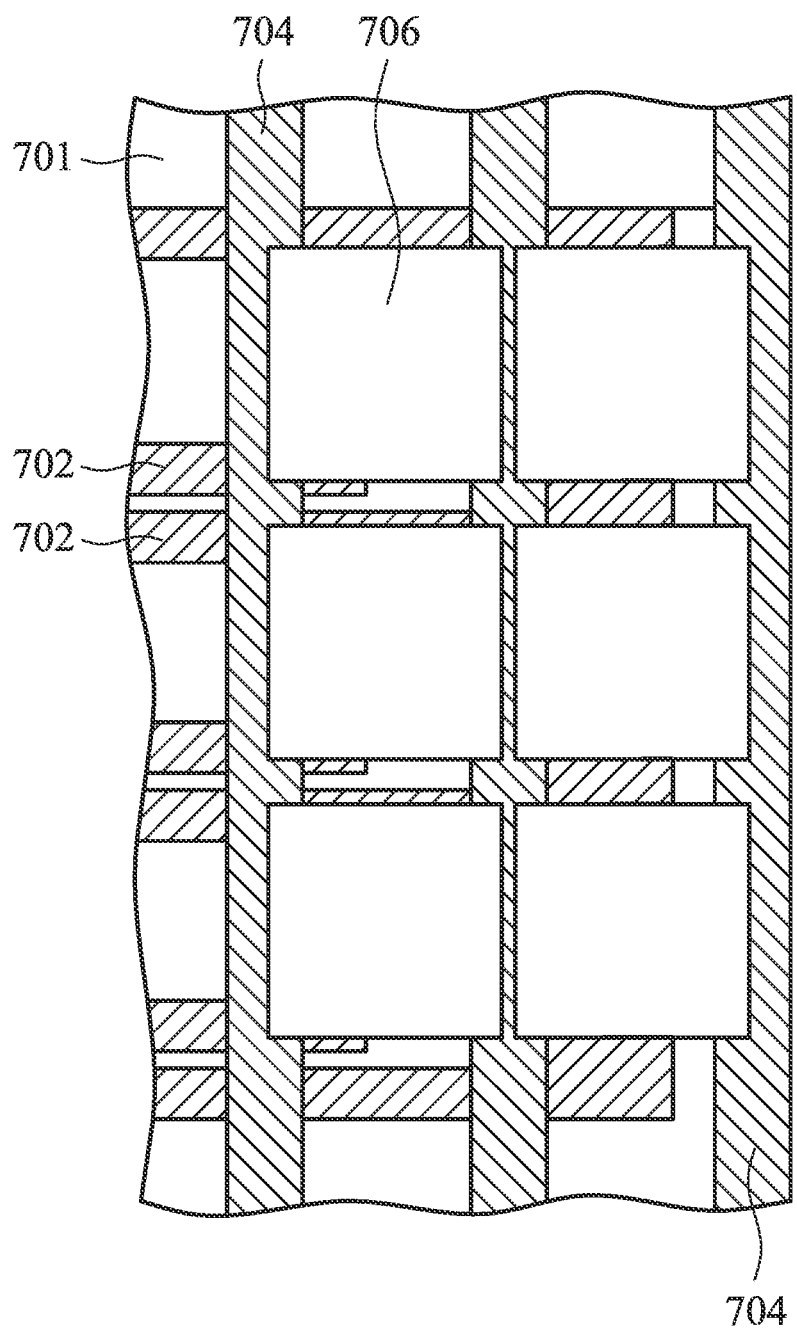
FIG. 7F is a top view of a pickup device in accordance with some other embodiments.

FIG. 7F is a top view of a pickup device 700F in accordance with other embodiments. As shown in FIG. 7F, each of the gate lines 702 is electrically connected to one of the pickup units 706, and each of the pickup units 706 may be controlled regarding whether to pick up a light-emitting element by controlling the signals of the gate lines 702 and the data lines 704 in accordance with other embodiments.

Figure 7G:
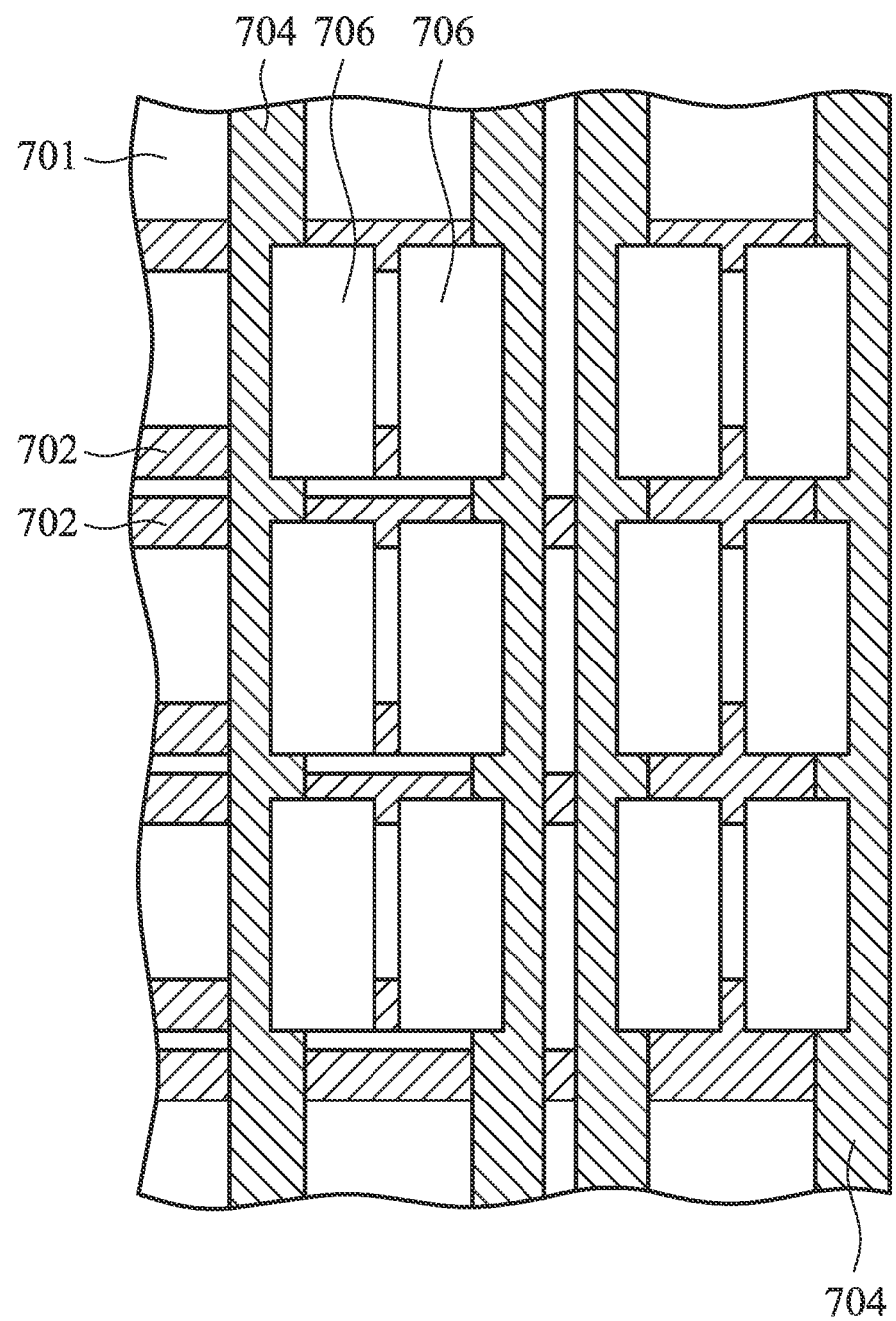
FIG. 7G is a top view of a pickup device in accordance with some other embodiments.

FIG. 7G is a top view of a pickup device 700G in accordance with other embodiments. As shown in FIG. 7, each of the pickup units 706 is electrically connected to one of the gate lines 702 and one of the data lines 704, and each of the pickup units 706 may be controlled as to whether to pick up a light-emitting element by controlling the signals of the gate lines 702 and the data lines 704 in accordance with other embodiments.

Figure 8B:
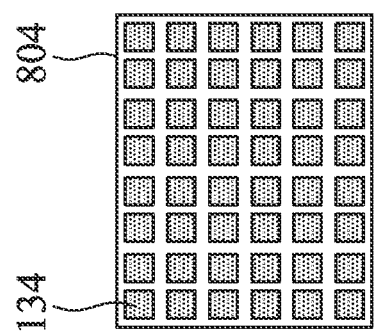
FIGS. 8A-8B are top views illustrating a carrier substrate and a display device in one of the steps of the method for manufacturing a display device in accordance with some other embodiments.
Figure 8A:
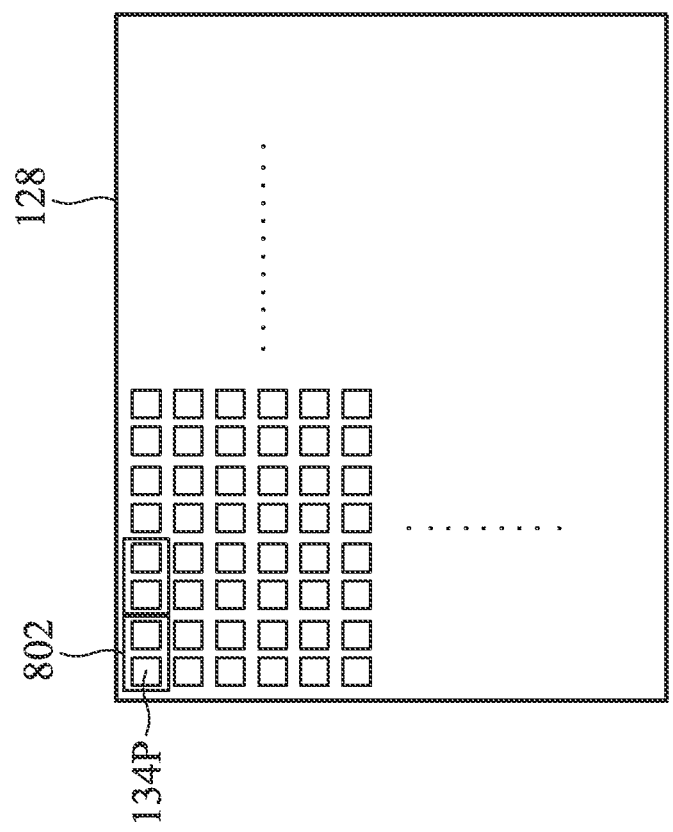
Figure 8C:
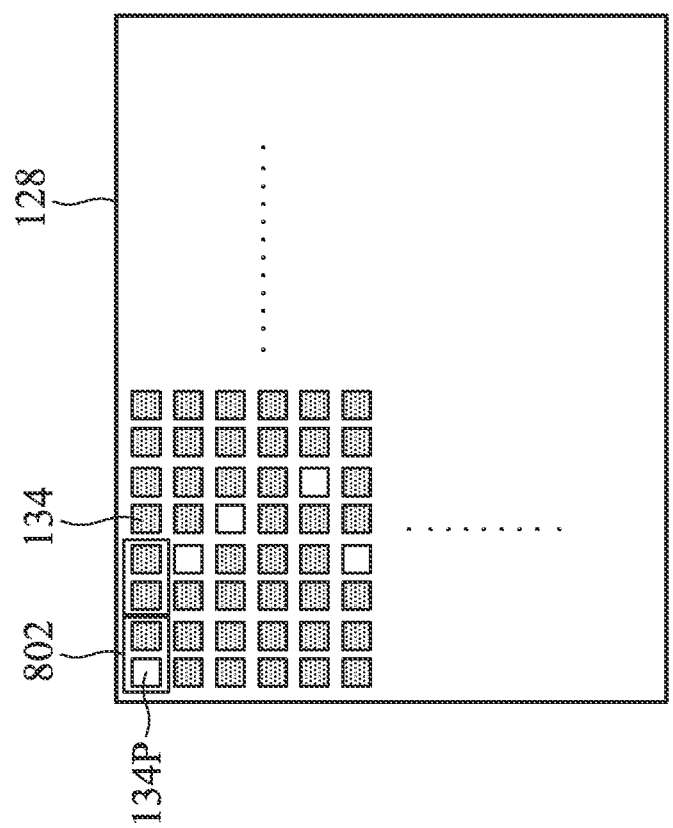
FIG. 8C is a top view illustrating a display device in one of the steps of the method for manufacturing a display device in accordance with some other embodiments.

In some embodiments, light-emitting elements may be placed over the transistor layer by the methods shown in FIGS. 8A-8C as follows. FIGS. 8A-8C are top views of the carrier substrate and the transistor layer 128 illustrating one of the steps of the method for manufacturing the display device in accordance with some embodiments. As shown in FIG. 8A, multiple sub-pixel regions 802 are included on the transistor layer 128, and each of the sub-pixel regions 802 has two light-emitting element predetermined disposing regions 134P in accordance with some embodiments.

Then, as shown in FIG. 8B, a carrier substrate 804 is provided in accordance with some embodiments. Multiple light-emitting elements 134 are disposed on the carrier substrate 804, and each of the light-emitting elements 134 corresponds to one of the light-emitting element predetermined disposing regions 134P on the transistor layer 128. Next, a test may be performed on the multiple light-emitting elements 134 on the carrier substrate 804.

Then, as shown in FIG. 8C, the one or more light-emitting element 134 that passes the test is selectively picked up by the aforementioned pickup device (i.e. the pickup device 700A, 700E, 700F, or 700G), and the light-emitting elements 134 that pass the test are disposed on the transistor layer 128 corresponding to the light-emitting element predetermined disposing regions 134P in accordance with some embodiments.

The light-emitting elements are placed on the transistor layer by the methods as described above in some embodiments, and that may avoid disposing the light-emitting elements 134 that do not pass the test on the transistor layer. Therefore, the process for repairing light-emitting elements 134 that do not pass the test and disposed on the transistor layer may be omitted. Thus, the production cost may be reduced.

Figure 9B:
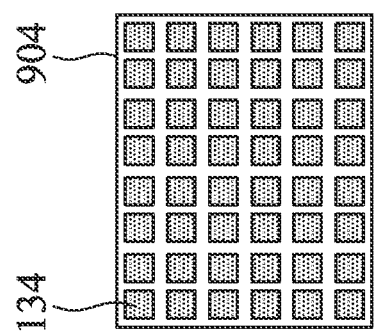
FIGS. 9A-9B are top views illustrating a carrier substrate and a display device in one of the steps of the method for manufacturing a display device in accordance with some other embodiments.
Figure 9A:
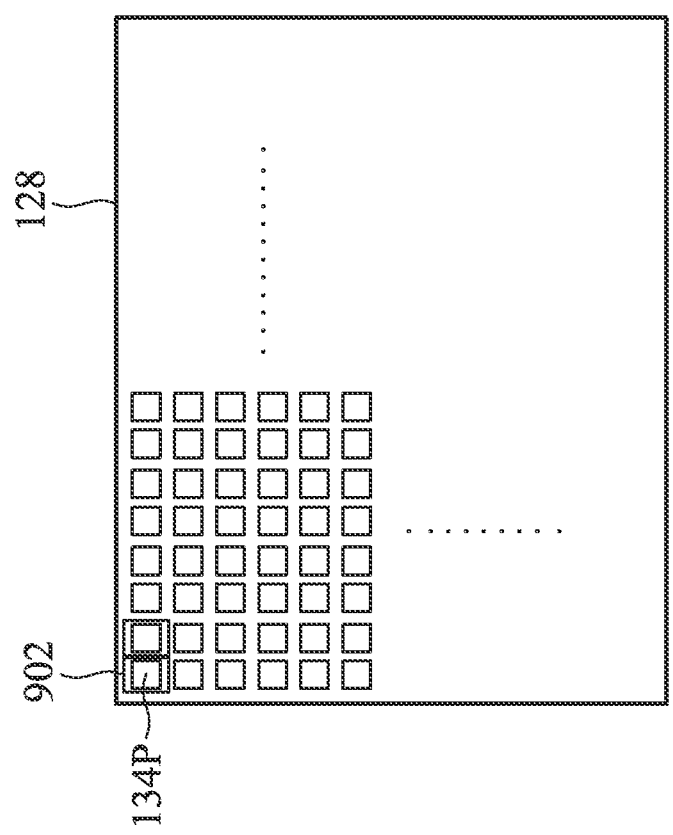

In some other embodiments, light-emitting elements may be placed on the transistor layer by the methods shown in FIGS. 9A-9D as follows. FIGS. 9A-9B are top views of the carrier substrate and the transistor layer 128 illustrating one of the steps of the method for manufacturing the display device in accordance with some embodiments. As shown in FIG. 9A, multiple sub-pixel regions 902 are included on the transistor layer 128, and each of the sub-pixel regions 902 has one light-emitting element predetermined disposing region 134P in accordance with some embodiments.

Next, as shown in FIG. 9B, a carrier substrate 904 is provided. Multiple light-emitting elements 134 are disposed on the carrier substrate 904, and each of the light-emitting elements 134 corresponds to one of the light-emitting element predetermined disposing regions 134P on the transistor layer 128. Next, a test may be performed on the multiple light-emitting elements 134 on the carrier substrate 904 in accordance with some embodiments.

Figure 9D:
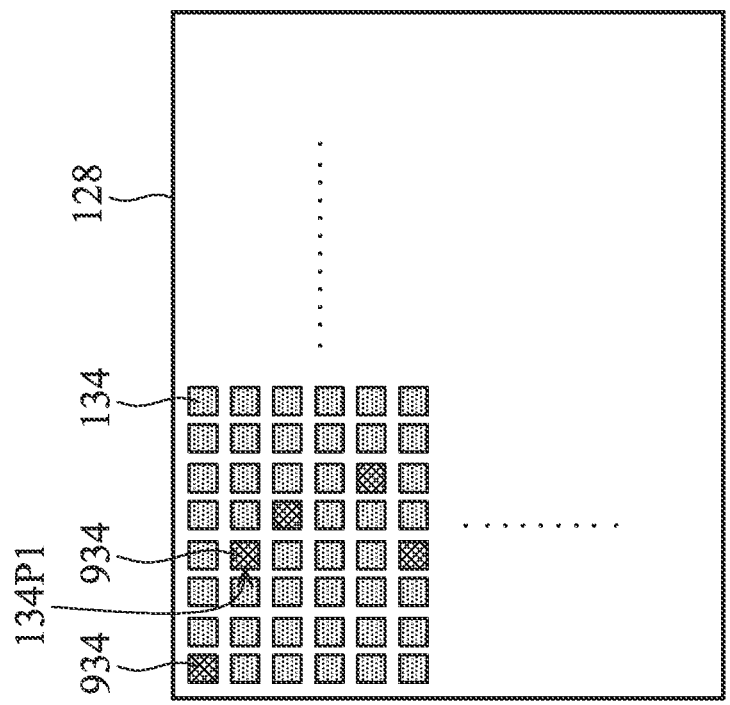
FIG. 9D is a top view illustrating a display device in one of the steps of the method for manufacturing a display device in accordance with some other embodiments.
Figure 9C:
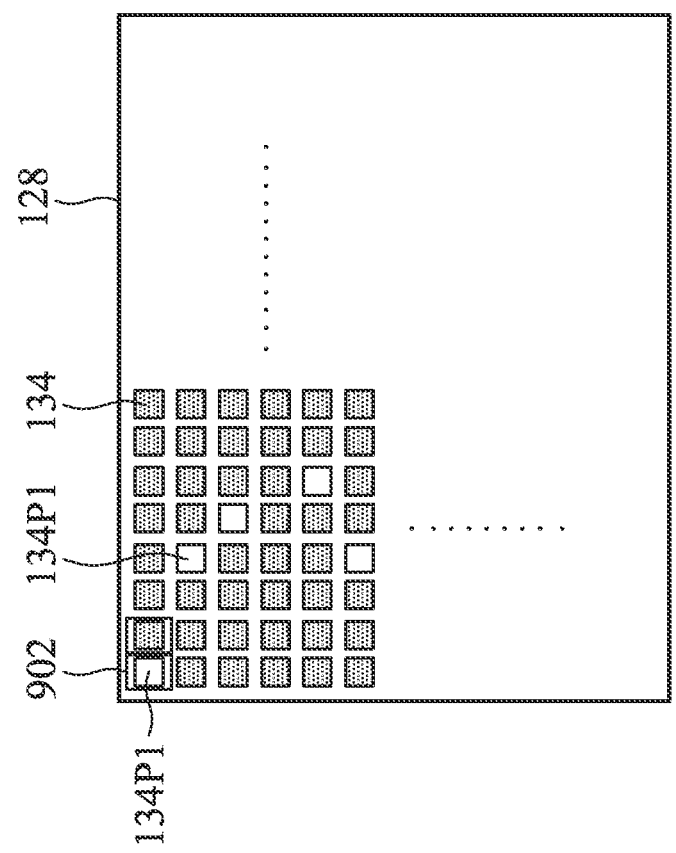
FIG. 9C is a top view illustrating a display device in one of the steps of the method for manufacturing a display device in accordance with some other embodiments.

Then, as shown in FIG. 9C, the one or more light-emitting element 134 that passes the test is selectively picked up by the aforementioned pickup device (i.e. the pickup device 700A, 700E, 700F, or 700G), and the light-emitting elements 134 that pass the test are disposed on the transistor layer 128 corresponding to the light-emitting element predetermined disposing regions 134P in accordance with some embodiments.

It should be noted that as shown in FIG. 9C, no light-emitting element is disposed on the light-emitting element predetermined disposing regions 134P (for example, the light-emitting element predetermined disposing region 134P1) corresponding to one or more light-emitting elements 134 that do not pass the test.

Next, as shown in FIG. 9D, another one or more light-emitting element 934 that passes the test is picked up and disposed at the one or more light-emitting element predetermined disposing region 134P1 corresponding to the one or more light-emitting elements 134 that do not pass the test.

The light-emitting elements are placed on the transistor layer by the methods as described above in some embodiments, and that may avoid disposing the light-emitting elements that do not pass the test on the transistor layer. Therefore, the process for repairing light-emitting elements that do not pass the test and is disposed on the transistor layer may be omitted. Thus, the production cost may be reduced.

Figure 10A:
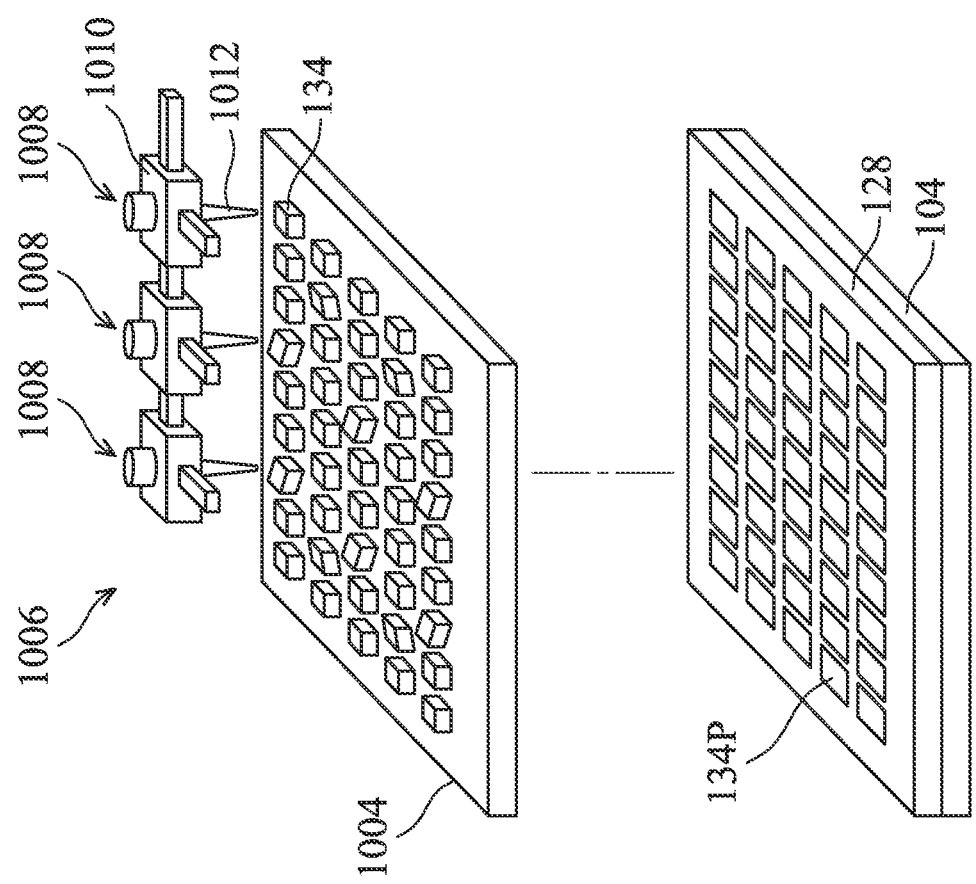
FIG. 10A is a side view illustrating a pickup device and a display device in one of the steps of the method for manufacturing a display device in accordance with some other embodiments.

In some embodiments, light-emitting elements may be placed on the transistor layer by the methods shown in FIGS. 10A-10C as follows. FIG. 10A is a side view illustrating the pickup device, the carrier substrate and the transistor layer in one of the steps of the method for manufacturing the display device in accordance with some embodiments. As shown in FIG. 10A, multiple light-emitting element predetermined disposing regions 134P are included on the transistor layer 128 in accordance with some embodiments.

Moreover, as shown in FIG. 10A, a carrier substrate 1004 is provided in accordance with some embodiments. Multiple light-emitting elements 134 are disposed on the carrier substrate 1004, and the multiple light-emitting elements 134 respectively corresponds to the multiple light-emitting element predetermined disposing regions 134P.

As shown in FIG. 10A, a pickup device 1006 is provided in accordance with some embodiments. The pickup device 1006 includes multiple pickup units 1008, and each of the multiple pickup units 1008 includes a calibration unit 1010 and a pickup head 1012 connected to the calibration unit 1010. In some embodiments, the calibration unit 1010 includes a piezoelectric material.

Figure 10C:
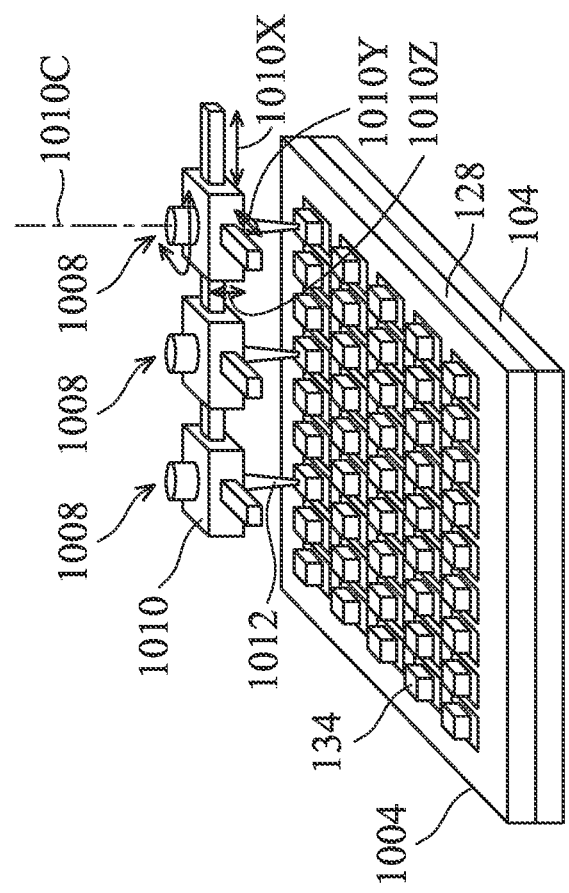
FIG. 10C is a side view illustrating a pickup device and a display device in one of the steps of the method for manufacturing a display device in accordance with some other embodiments.
Figure 10B:
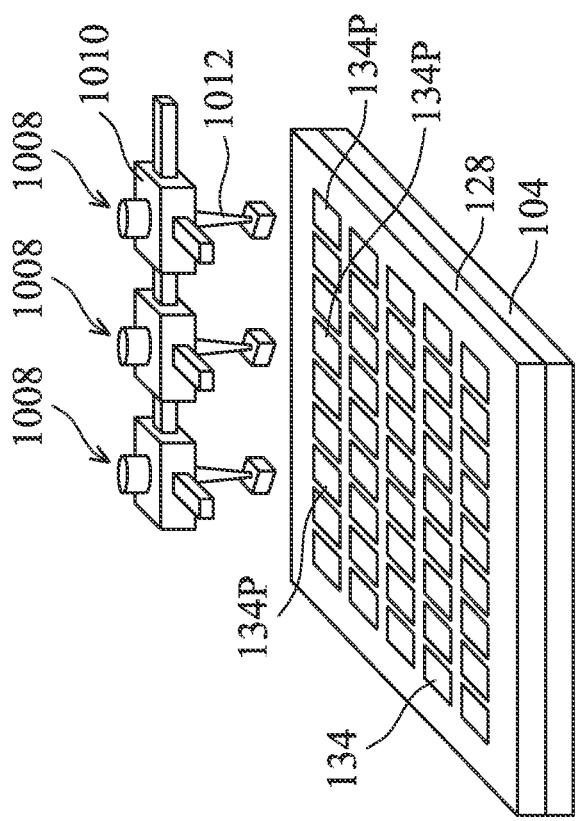
FIG. 10B is a side view illustrating a pickup device and a display device in one of the steps of the method for manufacturing a display device in accordance with some other embodiments.

Next, as shown in FIG. 10B, one or more light-emitting elements 134 are picked up by the pickup head 1012 of the pickup device 1006 in accordance with some embodiments. The one or more light-emitting element 134 which is picked up is placed at the position substantially corresponding to the light-emitting element predetermined disposing region 134P.

Then, as shown in FIG. 10C, a voltage is applied to the calibration unit 1010 in order to change the size of the calibration unit 1010, so that the pickup head 1012 and the light-emitting element 134 are moved or rotated, and the light-emitting element 134 is aligned with the light-emitting element predetermined disposing regions 134P.

In some embodiments, as shown in FIG. 10C, the calibration unit 1010 has a rotating axis 1010C and three moving axes 1010X, 1010Y and 1010Z in accordance with some embodiments. As shown in FIG. 10C, the calibration unit 1010 may rotate clockwise or counterclockwise as the rotating axis 1010C is the axle center, or the calibration unit 1010 may move along the moving axes 1010X, 1010Y and 1010Z.

In some embodiments, light-emitting elements may be placed on the transistor layer by the methods shown in FIGS. 11A-11C as follows. FIG. 11A is a side view illustrating the carrier substrate in one of the steps of the method for manufacturing the display device in accordance with some embodiments. As shown in FIG. 11A, a carrier substrate 1104 is provided in accordance with some embodiments. Multiple light-emitting elements 134 are disposed on the carrier substrate 1104, and each of the light-emitting elements 134 corresponds to one subsequent light-emitting element predetermined disposing region 134P.

Figure 11B:
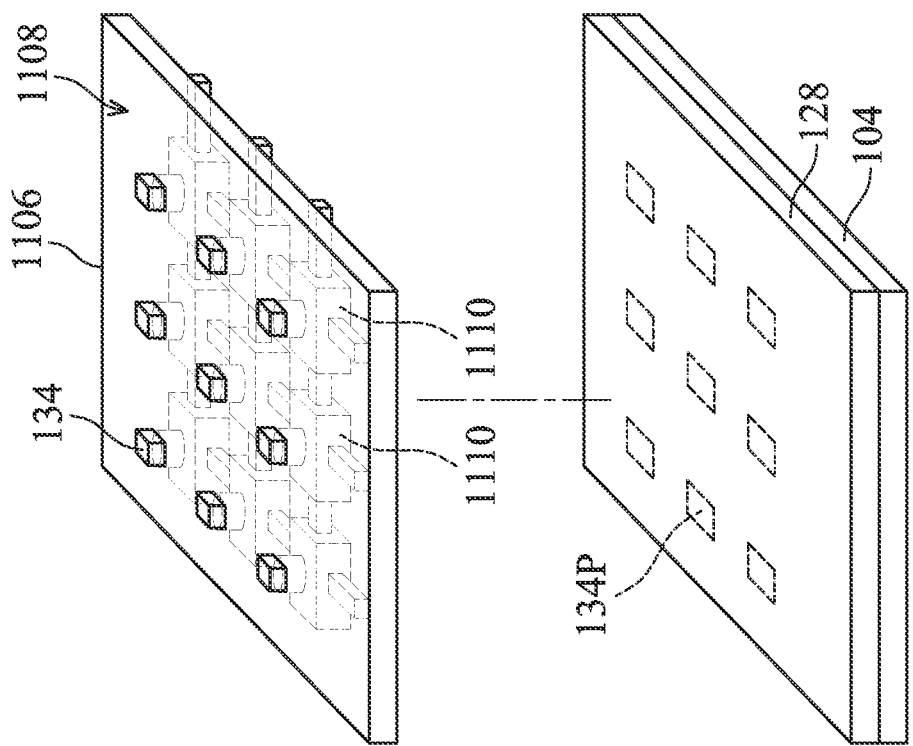
FIG. 11B is a side view illustrating a pickup device and a display device in one of the steps of the method for manufacturing a display device in accordance with some other embodiments.
Figure 11A:
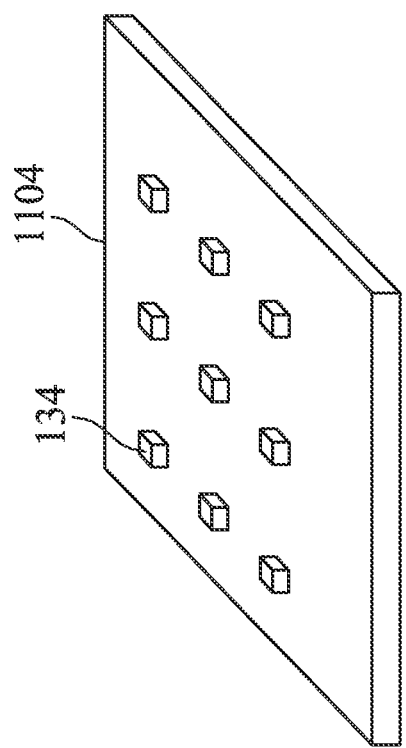
FIG. 11A is a side view illustrating a pickup device and a display device in one of the steps of the method for manufacturing a display device in accordance with some other embodiments.

Next, as shown in FIG. 11B, a pickup device 1106 is provided in accordance with some embodiments. The pickup device 1106 includes a piezoelectric unit matrix 1108, and the piezoelectric unit matrix 1108 has multiple piezoelectric units 1110. Then, the light-emitting elements 134 are picked up by the pickup device 1106, and each of the light-emitting elements 134 corresponds to one of the piezoelectric units 1110.

Next, as shown in FIG. 11B, a transistor layer 128 is provided in accordance with some embodiments. The transistor layer 128 includes multiple light-emitting element predetermined disposing regions 134P thereon, and each of the light-emitting elements 134 on the pickup device 1106 substantially corresponds to the position of one of the light-emitting element predetermined disposing regions 134P.

Then, as shown in FIG. 11B, a voltage is applied to one or more piezoelectric unit 1110 in order to change the size of the one or more piezoelectric unit 1110, and the one or more light-emitting element 134 disposed corresponding to the one or more piezoelectric unit 1110 is moved or rotated, so that the light-emitting element 134 is aligned with the corresponding light-emitting element predetermined disposing regions 134P in accordance with some embodiments.

Figure 11C:
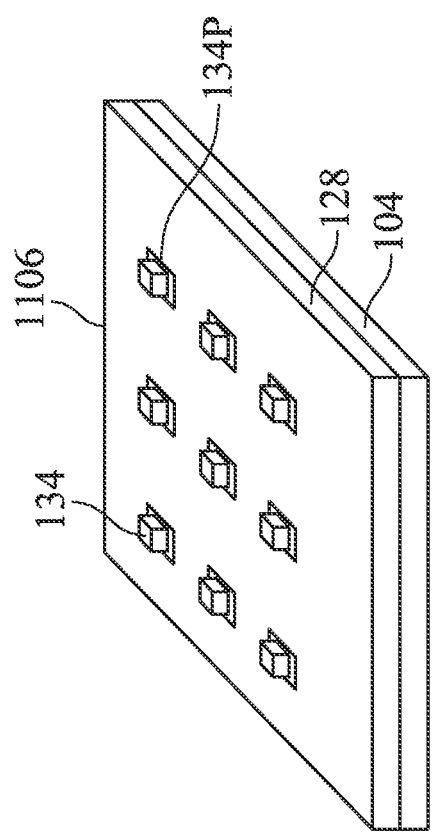
FIG. 11C is a side view illustrating a display device in one of the steps of the method for manufacturing a display device in accordance with some other embodiments.

Next, as shown in FIG. 11C, the light-emitting elements 134 on the pickup device 1106 are placed on the transistor layer 128 corresponding to the light-emitting element predetermined disposing regions 134P in accordance with some embodiments.

In some embodiments, light-emitting elements are placed on the anisotropic conductive blocks on the transistor layer by the methods shown in FIG. 12A as follows, and the anisotropic conductive blocks that the light-emitting elements are disposed on are hardened.

Figure 12A:
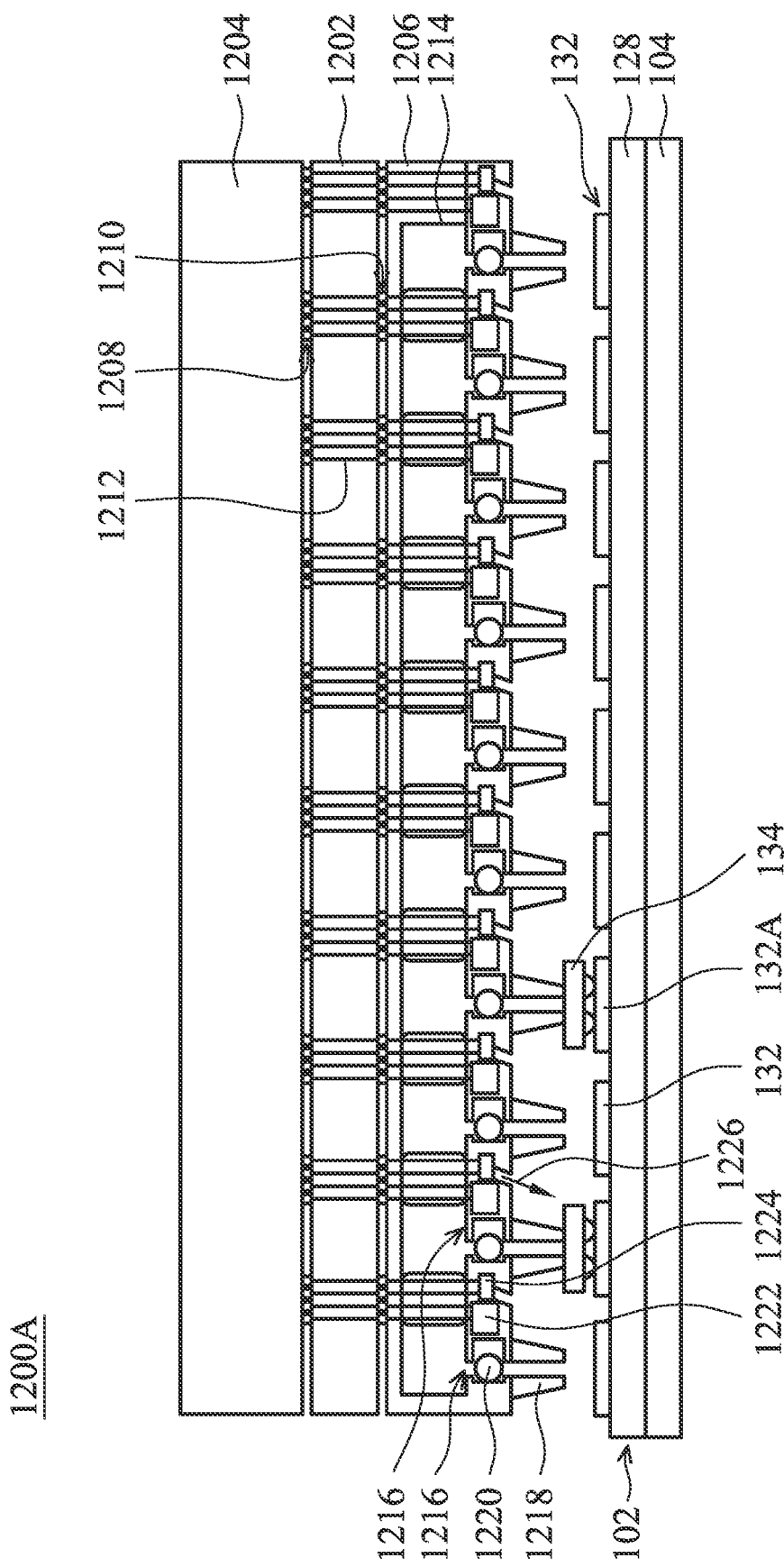
FIG. 12A is a top view illustrating a pickup device and a display device in one of the steps of the method for manufacturing a display device in accordance with some other embodiments.

FIG. 12A is a cross-sectional view illustrating a pickup device 1200A and the substrate 104 in one of the steps of the methods for manufacturing the display devices in accordance with some embodiments. As shown in FIG. 12A, there is a patterned ACF 132 on the transistor layer 128. The patterned ACF 132 has one or more anisotropic conductive block 132A.

Next, a pickup device 1200A is provided. The pickup device 1200A includes a substrate 1202, a control circuit board 1204 and a pickup portion 1206. As shown in FIG. 12A, the substrate 1202 and the control circuit board 1204 are connected through a conductive connection portion 1208, and the substrate 1202 and the pickup portion 1206 are connected through another conductive connection portion 1210. A conductive layer 1212 is disposed inside the substrate 1202 and electrically connected to the corresponding conductive connection portions 1208 and 1210.

Referring to FIG. 12A, in some embodiments, the pickup portion 1206 includes a chamber 1214. In some embodiments, the chamber 1214 may be a vacuum chamber.

Referring to FIG. 12A, in some embodiments, the pickup portion 1206 includes multiple pickup units 1216, and each of the pickup units 1216 includes a pickup head 1218 and a clog 1220 disposed corresponding to the pickup head 1218. In addition, the pickup units 1216 include motors 1222 controlling the clogs 1220. The pickup heads 1218 may be controlled as to whether to pick up light-emitting elements by controlling the motors 1222 and the clogs 1220.

Referring to FIG. 12A, in some embodiments, the pickup units 1216 include light-emitting units 1224 disposed adjacent to the pickup heads 1218. The light-emitting units 1224 may emit UV light or any other light that may harden the anisotropic conductive blocks 132A.

Then, as shown in FIG. 12A, the light-emitting elements 134 are picked up by the pickup head 1218 of at least one pickup unit 1216, and placed on the anisotropic conductive blocks 132A in some embodiments.

Referring to FIG. 12A, in some embodiments, having the light-emitting elements 1224 emit light 1226 to irradiate the anisotropic conductive blocks 132A that the light-emitting elements 134 are disposed on is in order to harden the anisotropic conductive blocks 132A.

The flexibility of the process may increase by selectively hardening the anisotropic conductive blocks 132A that the light-emitting elements 134 are disposed on in some embodiments.

Figure 12B:
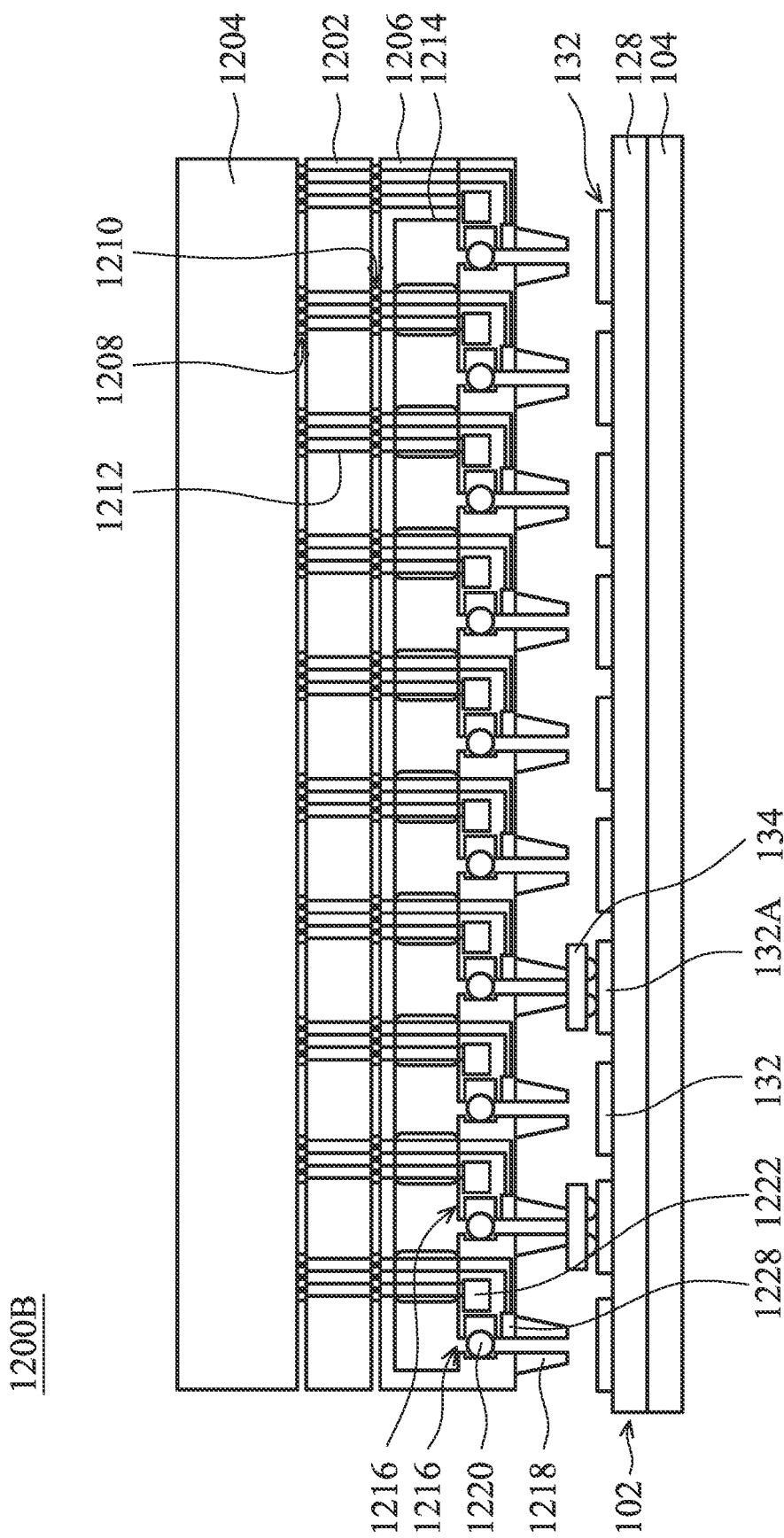
FIG. 12B is a top view illustrating a pickup device and a display device in one of the steps of the method for manufacturing a display device in accordance with some other embodiments.

FIG. 12B is a cross-sectional view illustrating a pickup device 1200B and the substrate 104 in one of the steps of the methods for manufacturing the display devices in accordance with some embodiments. As shown in FIG. 12B, the pickup units 1216 of the pickup device 1200B include heating units 1228 disposed adjacent to the pickup heads 1218.

Next, as shown in FIG. 12B, the light-emitting elements 134 are picked up by the pickup heads 1218 of at least one pickup unit 1216, and placed on the anisotropic conductive blocks 132A in some embodiments.

In some embodiments, before hardening the anisotropic conductive blocks 132A, the substrate 104 and the anisotropic conductive blocks 132A are preheated to a predetermined temperature that may be substantially 10° C.-30° C. lower than the hardening temperature of the anisotropic conductive blocks 132A, such as substantially 15° C.-25° C. lower, or about 20° C. lower. However, in other embodiments, the substrate 104 and the anisotropic conductive blocks 132A are not preheated.

Then, as shown in FIG. 12B, having the heating units 1228 heat the anisotropic conductive blocks 132A that the light-emitting elements 134 are disposed on makes the temperature of the anisotropic conductive blocks 132A is greater than or equivalent to the hardening temperature of the anisotropic conductive blocks 132A in some embodiments. Thus, the anisotropic conductive blocks 132A are hardened.

Figure 13A:
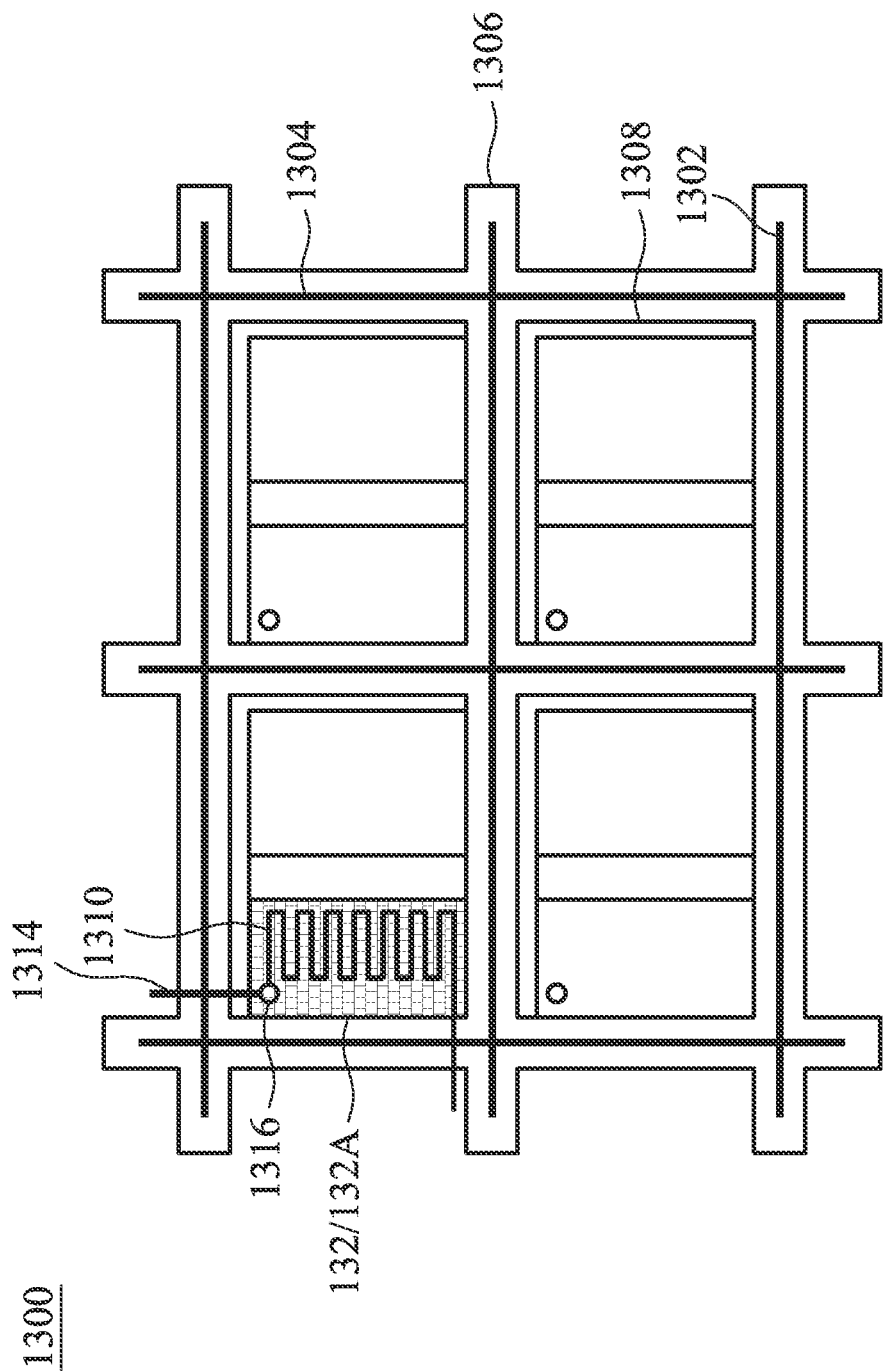
FIG. 13A is a top view of a display device in accordance with some other embodiments.

In some embodiments, the anisotropic conductive blocks that the light-emitting elements are disposed on are hardened by the method shown in FIGS. 13A-13E-2 as follows. FIG. 13A is a top view of a display device 1300 in accordance with other embodiments. As shown in FIG. 13A, the display device 1300 includes multiple gate lines 1302 and multiple data lines 1304, and a shielding pattern 1306 is disposed thereon to shield the multiple gate lines 1302 and multiple data lines 1304. The display device 1300 further includes multiple sub-pixel regions 1308.

Figure 13C:
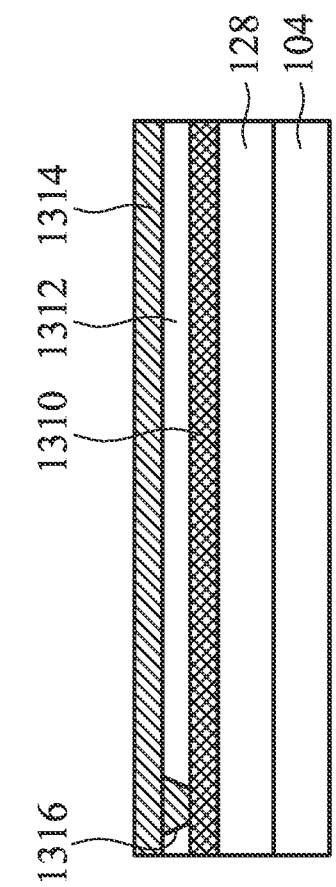
FIG. 13C is a cross-sectional view of a display device in accordance with some other embodiments.
Figure 13B:
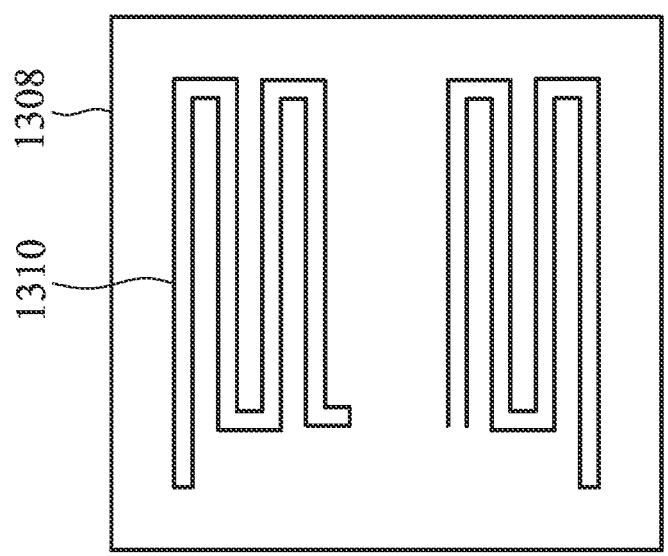
FIG. 13B is a top view of a display device in accordance with some other embodiments.

FIG. 13B is a top view of a sub-pixel region 1308 in accordance with some embodiments. FIG. 13C is a cross-sectional view of the display device 1300 in accordance with some embodiments. As shown in FIGS. 13A-13C, before forming the patterned ACF 132, patterned resistance wires 1310 disposed corresponding to the sub-pixel regions 1308 are formed on the transistor layer 128 of the sub-pixel regions 1308.

In some embodiments, the material of the patterned resistance wires 1310 may include transparent conductive materials, for example, ITO, SnO, IZO, IGZO, ITZO, ATO, AZO, a combination thereof, or any other suitable transparent conductive oxide material. The material of the patterned resistance wires 1310 may be formed by the aforementioned CVD, sputtering deposition, resistance heating evaporation, electron beam evaporation, or any other suitable deposition method.

Next, as shown in FIG. 13C, an insulating layer 1312 is disposed on the patterned resistance wires 1310, and a wire 1314 is disposed on the insulating layer 1312 in accordance with some embodiments. In some embodiments, the wire 1314 is electrically connected to the patterned resistance wires 1310 through a via 1316. In some embodiments, the wire 1314 is a portion of a patterned conductive layer, and the patterned conductive layer includes multiple wires 1314. In some embodiments, the patterned conductive layer may be, for example, the aforementioned third patterned conductive layer.

In some embodiments, the insulating layer 1312 may be silicon nitride, silicon dioxide, silicon oxynitride, or any other suitable insulating material. In some embodiments, the insulating layer 1312 may be formed by the aforementioned CVD, spin-on coating, or any other suitable method.

In some embodiments, the material of the wires 1314 may include Cu, Al, Mo, W, Au, Cr, Ni, Pt, Ti, Ir, Rh, an alloy thereof, a combination thereof, or another metal material with good conductivity. In other embodiments, the material of the wires 1314 may be a non-metal material, as long as the material used has conductivity. In some embodiments, the material of the wires 1314 may be formed by the aforementioned CVD, sputtering deposition, resistance heating evaporation, electron beam evaporation, or any other suitable deposition method.

Next, as shown in FIG. 13A, the patterned ACF 132 is formed in accordance with some embodiments. The patterned ACF 132 has at least one anisotropic conductive block 132A disposed corresponding to the sub-pixel region 1308. In some embodiments, the patterned ACF 132 is disposed on the transistor layer 128, and the patterned resistance wires 1310 and the wires 1314 are disposed between the transistor layer 128 and the patterned ACF 132.

In some embodiments, after forming the patterned ACF 132, light-emitting elements (not shown) may be disposed on the anisotropic conductive blocks 132A corresponding to the sub-pixel regions 1308.

Then, through the wires 1314, the patterned resistance wires are electrified to heat and harden the anisotropic conductive blocks 132A that the light-emitting elements 134 are disposed on.

In some embodiments, the total length of the patterned resistance wires 1310 disposed in one sub-pixel region 1308 is in a range from about 1 μm to about 100 μm, such as from about 10 μm to about 80 μm, or from about 30 μm to about 50 μm. In some embodiments, the width of the patterned resistance wires 1310 is in a range from about 50 nm to about 50 μm, such as from about 100 nm to about 10 μm, or from about 500 nm to about 1 μm.

Figures 1, 2, 13D:
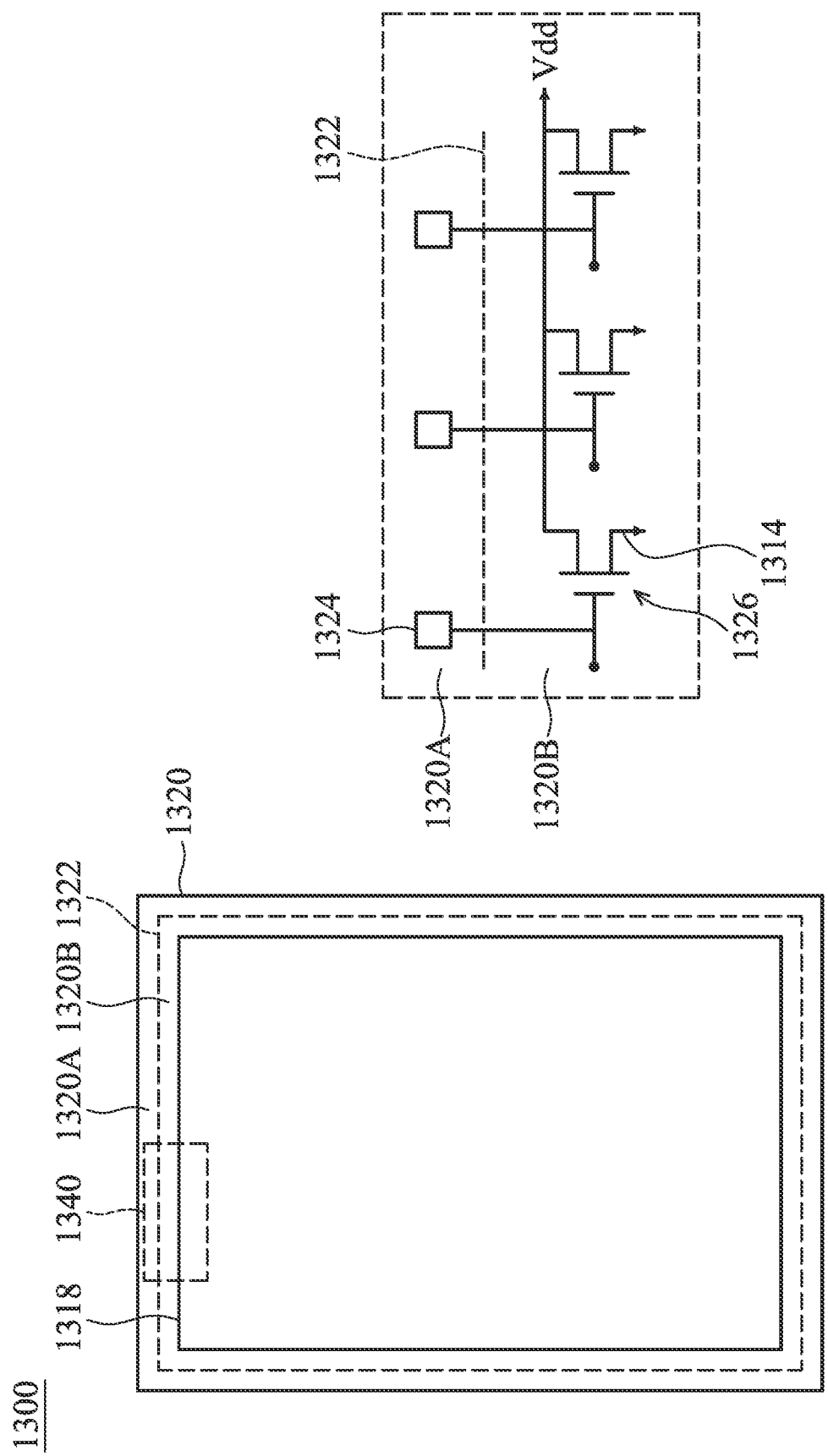

FIG. 13D-1 is a top view of the display device 1300 in accordance with other embodiments. FIG. 13D-2 is an enlarged view of the region 1340 of FIG. 13D-1. As shown in FIGS. 13D-1 and 13D-2, the display device 1300 includes a display region 1318 and a peripheral region 1320. A cutting line 1322 surrounding the display region is disposed in the peripheral region 1320. As shown in FIGS. 13D-1 and 13D-2, the cutting line 1322 divides the peripheral region 1320 into an outer portion 1320A away from the display region 1318 and an inner portion 1320B adjacent to the display region 1318. Multiple conductive pads are disposed in the outer portion 1320A of the peripheral region 1320, and multiple transistor circuits 1326 are disposed in the inner portion 1320B of the peripheral region 1320. The gate of each of the transistor circuits 1326 is connected to one conductive pad 1324, the source thereof is connected to the wires 1314, and the drain thereof is connected to the operating voltage. The wires 1314 are controlled regarding whether to input electronic current via the transistor circuits 1326.

Figures 1, 2, 13E:
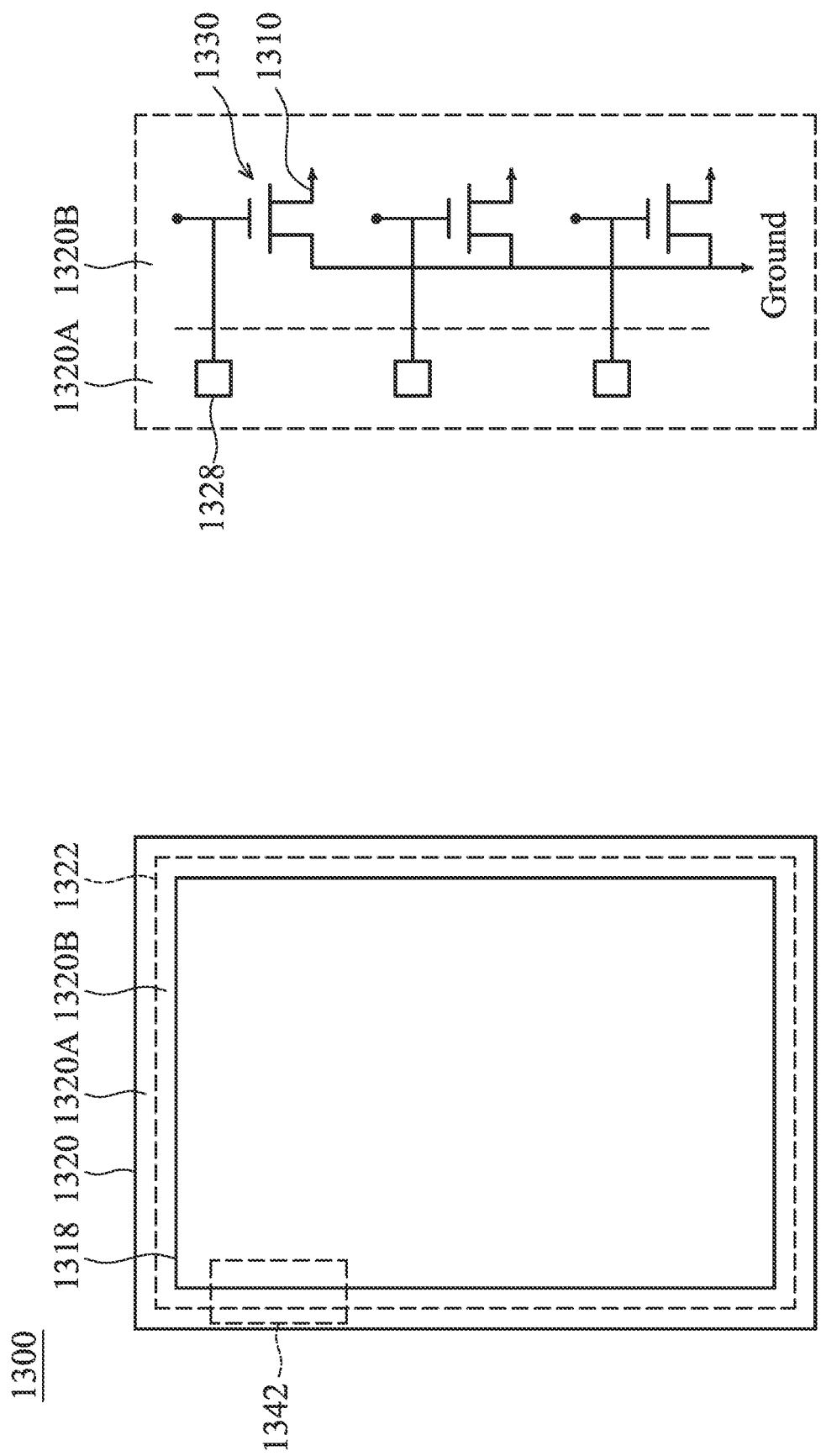

FIG. 13E-1 is a top view of the display device 1300 in accordance with other embodiments. FIG. 13E-2 is an enlarged view of the region 1342 of FIG. 13E-1. As shown in FIGS. 13E-1 and 13E-2, multiple conductive pads 1328 are disposed in the outer portion 1320A of the peripheral region 1320, and multiple transistor circuits 1330 are disposed in the inner portion 1320B of the peripheral region 1320. The gate of each of the transistor circuits 1330 is connected to one conductive pad 1328, the source is connected to the patterned resistance wires 1310, and the drain is connected to ground. The patterned resistance wires 1310 are controlled as to whether an electronic current is input via the transistor circuits 1330.

As described above, according to some embodiments of the present disclosure, in the display device, a capacitor is formed by the pixel electrode disposed on the transistor layer and the conductive connection portion in the transistor layer to improve the display quality of the display device.

In addition, it should be noted that those skilled in the art will appreciate that the source and drain may be exchanged in the embodiments of the present disclosure because the definition of that is relative to the voltage levels connected to them.

It should be noted that the aforementioned sizes, parameters and shapes of the elements are not limitations of the present disclosure. Those skilled in the art may adjust these settings according to different needs. Moreover, the substrates, display devices and the methods for manufacturing the same are not limited to the configurations shown in FIGS. 1A-13E. Some embodiments of the present disclosure may just include any one or more features of any one or more embodiment of FIGS. 1A-13E. That is to say, not every feature of all the drawings is performed in the substrates, display devices and the methods for manufacturing the same of the present disclosure.

While the invention has been described by way of example and in terms of preferred embodiment, it is to be understood that those skilled in the art may make various changes, substitutions, and alterations to the invention without departing from the spirit and scope of the present disclosure. In addition, the scope of the present disclosure is not limited to the process, machines, manufacture, composition, devices, methods and steps in the specific embodiments described in the specification. Those skilled in the art may understand existing or developing process, machines, manufacture, composition, devices, methods and steps from some embodiments of the present disclosure, as long as may be performed in the aforementioned embodiments and obtain substantially the same result may be used in accordance with some embodiments of the present disclosure. Therefore, the scope of the present disclosure includes the aforementioned processes, machines, manufacture, composition, devices, methods and steps. Furthermore, each of the appended claims constructs an individual embodiment, and the scope of the present disclosure also includes every combination of the appended claims and embodiments.

What is claimed is:

1. A display device, comprising:
a substrate having a top surface;
a light-emitting element disposed on the substrate, the light-emitting element comprising a first electrode and a second electrode;
a transistor disposed on the substrate and electrically connected to the light-emitting element, the transistor comprising:
a gate electrode; and
a semiconductor layer comprising an overlapping portion overlapped with the gate electrode;
a color filter layer disposed on the light-emitting element; and
a light conversion layer disposed on the light-emitting element;
wherein the color filter layer is disposed on the light conversion layer, and a width of the color filter layer is greater than a width of the light conversion layer;
wherein the first electrode and the second electrode of the light-emitting element do not overlap with the overlapping portion along a direction perpendicular to the top surface of the substrate.

2. The display device of claim 1, further comprising an insulating layer disposed on the substrate and having a recess, wherein the light-emitting element is disposed in the recess.

3. The display device of claim 1, wherein the light-emitting element comprises a semiconductor layer, and the first electrode and the second electrode are disposed on the same side of the semiconductor layer.

4. The display device of claim 1, wherein the transistor comprises a drain electrode electrically connected to the light-emitting element.

5. The display device of claim 1, wherein the light conversion layer does not overlap with the overlapping portion.

6. The display device of claim 1, wherein the color filter layer does not overlap with the overlapping portion.

7. A display device, comprising:
a substrate having a top surface;
a light-emitting element disposed on the substrate, the light-emitting element comprising a first electrode and a second electrode;
a transistor disposed on the substrate and electrically connected to the light-emitting element, the transistor comprising:
a gate electrode; and
a semiconductor layer comprising an overlapping portion overlapped with the gate electrode;
a color filter layer disposed on the light-emitting element;
a light conversion layer disposed on the light-emitting element; and
an insulating layer disposed on the substrate and having a recess, wherein the color filter layer is disposed on the light conversion layer, the light-emitting element is disposed in the recess, and the color filter layer and the light conversion layer overlap with the recess;
wherein the first electrode and the second electrode of the light-emitting element do not overlap with the overlapping portion along a direction perpendicular to the top surface of the substrate.

8. The display device of claim 1, wherein the color filter layer has a trapezoidal structure in a cross-sectional view.

9. The display device of claim 1, wherein the color filter layer partially overlaps the semiconductor layer of the transistor along the direction perpendicular to the top surface of the substrate.

10. The display device of claim 1, further comprising a light-shielding layer disposed adjacent to the color filter layer, wherein the light-shielding layer overlaps with the overlapping portion along the direction perpendicular to the top surface of the substrate.

11. The display device of claim 1, further comprising a pad disposed between the light-emitting element and the substrate.

12. The display device of claim 11, further comprising an insulating layer disposed on the transistor, the insulating layer having a recess, wherein the light-emitting element and the pad are disposed in the recess.

13. The display device of claim 11, wherein the pad does not overlap with the overlapping portion.

14. A display device, comprising:
a substrate having a top surface;
a light-emitting element disposed on the substrate, the light-emitting element comprising a first electrode and a second electrode; and
a transistor disposed on the substrate and electrically connected to the light-emitting element, the transistor comprising:
a gate electrode; and
a semiconductor layer comprising an overlapping portion overlapped with the gate electrode;
wherein the first electrode and the second electrode of the light-emitting element do not overlap with the overlapping portion along a direction perpendicular to the top surface of the substrate,
wherein the light-emitting element comprises an active layer, one of the first electrode or the second electrode overlap with the active layer along the direction perpendicular to the top surface of the substrate, and the other of the first electrode or the second electrode does not overlap with the active layer along the direction perpendicular to the top surface of the substrate.

* * * * *